US008766808B2

(12) United States Patent  
Hogasten

(10) Patent No.: US 8,766,808 B2  
(45) Date of Patent: Jul. 1, 2014

(54) IMAGER WITH MULTIPLE SENSOR ARRAYS

(75) Inventor: Nicholas Hogasten, Santa Barbara, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 606 days.

(21) Appl. No.: 13/043,123

(22) Filed: Mar. 8, 2011

(65) Prior Publication Data  
US 2011/0221599 A1 Sep. 15, 2011

Related U.S. Application Data

(60) Provisional application No. 61/312,146, filed on Mar. 9, 2010.

(51) Int. Cl.  
G08B 17/10 (2006.01)

(52) U.S. Cl.  
USPC . 340/632; 348/218.1; 348/187; 348/E17.002; 348/E5.024

(58) Field of Classification Search  
USPC ......... 340/632, 633, 634, 584, 555–557, 561, 340/565, 567; 348/E17.002, E5.024, E5.31, 348/E5.091, 164, 187, 222.1, 272, 294, 348/302, 218.1; 250/330, 332, 338.1, 250/338.4; 359/489.19, 589  
See application file for complete search history.

(56) References Cited

U.S. PATENT DOCUMENTS

| | | | |
|---|---|---|---|
| 4,956,686 A | 9/1990 | Borrello et al. | |
| 5,055,921 A | 10/1991 | Usui | |
| 5,726,805 A | 3/1998 | Kaushik et al. | |
| 5,777,328 A | 7/1998 | Gooch | |
| 6,226,034 B1 * | 5/2001 | Katayama | 348/242 |
| 6,563,582 B1 | 5/2003 | Chun | |
| 7,095,027 B1 | 8/2006 | Boreman et al. | |
| 7,663,662 B2 | 2/2010 | Miller et al. | |
| 2004/0100570 A1 | 5/2004 | Shizukuishi | |

(Continued)

FOREIGN PATENT DOCUMENTS

| | | |
|---|---|---|
| EP | 1096785 | 5/2001 |
| EP | 1811771 | 7/2007 |
| WO | WO 99/65248 | 12/1999 |
| WO | WO-2005/068955 | 7/2005 |

OTHER PUBLICATIONS

J W Duparre, F C Wippermann, "Micro-optical Artificial Compound Eyes", Institute of Physics Publishing, Bioinspiration & Biometrics, Apr. 6, 2006, pp. R1-R16.

(Continued)

*Primary Examiner* — Anh V La  
(74) *Attorney, Agent, or Firm* — Haynes and Boone, LLP

(57) ABSTRACT

An imager array may be provided as part of an imaging system. The imager array may include a plurality of sensor arrays (e.g., also referred to as lenslets or optical elements). Each sensor array may include a plurality of sensors (e.g., pixels) associated with a lens. The sensor arrays may be oriented, for example, substantially in a plane facing the same direction and configured to detect images from the same scene (e.g., target area). Such images may be processed in accordance with various techniques to provide images of electromagnetic radiation. The sensor arrays may include filters or lens coatings to selectively detect desired ranges of electromagnetic radiation. Such arrangements of sensor arrays in an imager array may be used to advantageous effect in a variety of different applications.

74 Claims, 18 Drawing Sheets

(56) References Cited

U.S. PATENT DOCUMENTS

| | | |
|---|---|---|
| 2005/0046865 A1 | 3/2005 | Brock et al. |
| 2005/0068517 A1 | 3/2005 | Evans et al. |
| 2005/0128509 A1* | 6/2005 | Tokkonen et al. ............ 358/1.15 |
| 2005/0134712 A1* | 6/2005 | Gruhlke et al. ............... 348/272 |
| 2006/0210279 A1 | 9/2006 | Hillis et al. |
| 2008/1016525 | 7/2008 | Boettiger |

OTHER PUBLICATIONS

R Volkel, M Eisner, J J Weible, "Miniaturized Imaging Systems", Microelectronic Engineering, 67-68 (2003) pp. 461-472.

Takeda Hiroyuki et al., "Super-resolution without Explicit Subpixel Motion Estimation", IEEE Transaction on Image Processing, vol. 18, No. 9, Sep. 2009, pp. 1958-1975.

Schuler M. Jonathan et al., "TARID-Based Image Superresolution", Naval Research Laboratory, Washington, DC, Proceedings of SPIE, vol. 4719 (2002), pp. 247-254.

Freeman T. William et al., "Example-Based Super-resolution", Mitsubishi Electric Research Laboratories$_T$ http://www.merl.com, Mar./Apr. 2002, pp. 56-65.

Hoelter R, Theodore, "Broad-Spectrum Performance Via VisGaAs", Advanced Imaging, The British Library, Sep. 2003.

Hoelter R. Theodore, Barton B. Jeffrey, "Extended Short Wavelength Spectral Response from InGaAs Focal Plane Arrays", http://www.flirthermograchy.com, Proceedings of SPIE, vol. 5074 (2003), pp. 481-490.

Baker Simon and Kanade Takeo, "Limits on Super-Resolution and How to Break Them", Proceedings IEEE Conference on Computer Vision and Pattern Recognition, vol. 24, No. 9, Sep. 2002, pp. 1167-1183.

Inspiration from Nature. SPIE Newsroom: SPIE, http://spie.org/x18285.xml?pf-true&highlight=x2422&ArticleID=x18285, Apr. 27, 2012, pp. 1-2.

Ledebuhr, Amo et al., Analysis of Active Sensor Discrimination Requirements for Various Missile Defense Scenarios Final Report 1999 (99-ERD-080), US Department of Energy, Lawrence Livemore National Laboratory; Feb. 15, 2000, pp. 1-7.

Definition of lider-Academic Press Dictionary of Science and Technology, 1992, 1996, Academic Press http://www.xrefplus.com/3123433.

Lidar—McGraw-Hill Encyclopedia of Science and Technology, McGraw-Hill Companies, Inc., Copyright 2005.

Angelo, Joseph A., The Dictionary of Space Technology, Facts on File, Inc., $2^{nd}$ Edition, 1999, pp. 336-337.

Scott, PRW, "The Fluorescence Detector", Liquid Chromatography Detectors, Library 4 Science; http://www.chromatography-online.orq/HPLC-Detectors/Fluorescence/rs55.html, 2003.

Definition of Polarization by Reflection, Hyperphysics; http://hyperphysics.phy-astr.gsu.edu/hbase/hph.html#ahph1, HyperPhysics, C.R. Nave, 2006.

N.S. Gluck et al., "Two-Color Imaging by the Use of Patterned Optical Filters Bonded to Focal-Plane-Array Detectors"; Applied Optics, vol. 35, No. 28, Oct. 1996; pp. 5520-5523.

P. Warren, D. Scribner, J. Schuler, M. Kruer, Multi-band Color Fusion Techniques, Critical Technology, Feb. 1998, Navel Research Laboratory, Code 5635, Washington, D.C., 20375, pp. 1-22.

Peter J. Burt, Edward H. Adelson, The Laplacian Pyramid as a Compact Image Code, IEEE Transactions on Communications, vol. Com-31, No. 4, Apr. 1983, pp. 532-540.

C. Pohl, J.L. Van Genderen, Multisensor Image Fusion in Remote Sensing: Concepts, Methods and Applications, Int. J. Remote Sensing, 1998, vol. 19, No. 5, pp. 823-854.

K. Schutte, Fusion of IR and Visual Images, TNO report FEL-97-B046, Feb. 1997, pp. 1-29.

Paul Chevrette, Daniel St. Germain, Jean Delisle, Robert Plante, Jean Fortin, Wide Area Coverage Infrared Surveillance System (Infrared Eye), Research and Development Branch, Department of National Defense, Canada, Jul. 1998, pp. 1-39.

Brion, J., et al., "Absorption Spectra Measurements for the Ozone Molecule in the 350-830 nm Region," Journal of Atmospheric Chemistry, vol. 30, No. 2, Jan. 1, 1998, pp. 291-299.

\* cited by examiner

IMAGER WITH MULTIPLE SENSOR ARRAYS

CROSS-REFERENCE TO RELATED APPLICATIONS

This application claims the benefit of U.S. Provisional Patent Application No. 61/312,146 filed Mar. 9, 2010, which is incorporated herein by reference in its entirety.

TECHNICAL FIELD

One or more embodiments of the invention relate generally to image sensors and more particularly, for example, to devices with multiple sets of image sensors and associated optics.

BACKGROUND

There are a wide variety of image detectors, such as visible light image detectors, infrared image detectors, or other types of image detectors that may be used to capture images for storage and display. Recent advances in process technology for focal plane arrays (FPAs) and image processing have led to increased capabilities and sophistication of resulting imaging systems. While these developments may provide improved features and image quality, they often negatively impact the size, weight, and power of associated systems. In particular, single aperture optical systems supporting multi-spectral imaging are typically complex, heavy, and expensive. In addition, high resolution sensors in the long wave infrared band may require very large apertures.

As an example, thermal cameras are used frequently in military and commercial applications. However, in many circumstances, size and weight limitations may render such thermal cameras unpractical. Cost is also an obstacle for market penetration in many applications. In particular, infrared camera optics often contribute significantly to the total cost and size of such devices. As a result, there is a need for improved image detector implementations that provide high capability without undue impact on size, weight, and power of image detectors or their associated devices.

SUMMARY

In accordance with various embodiments of the present disclosure, an imager array may be provided as part of an imaging system. The imager array may include a plurality of sensor arrays (e.g., also referred to as lenslets or optical elements). Each sensor array may include a plurality of sensors (e.g., pixels) associated with a lens.

The sensor arrays may be oriented, for example, substantially in a plane facing the same direction and configured to detect multiple images from the same scene (e.g., target area) using the imager array. Such images may be processed in accordance with various techniques to provide images of electromagnetic radiation. In some embodiments, the sensor arrays may include filters or lens coatings to selectively detect desired ranges of electromagnetic radiation. Such arrangements of sensor arrays in an imager array may be used to advantageous effect in a variety of different applications as described herein.

In accordance with an embodiment of the disclosure, an imaging system includes a housing; and an imager array disposed in the housing and adapted to image a scene, wherein the imager array comprises: a plurality of sensor arrays, wherein each sensor array comprises: a lens adapted to receive electromagnetic radiation from the scene; and a plurality of sensors adapted to capture an image of the scene based on the electromagnetic radiation received through the lens.

In accordance with another embodiment of the disclosure, a method of imaging includes receiving electromagnetic radiation from a scene at an imager array disposed in a housing of an imaging system, wherein the imager array comprises a plurality of sensor arrays, wherein each sensor array comprises a lens adapted to receive the electromagnetic radiation from the scene and a plurality of sensors adapted to capture an image of the scene based on the electromagnetic radiation received through the lens; and capturing a plurality of images of the scene substantially simultaneously using the sensors of the sensor arrays.

In accordance with another embodiment of the disclosure, a gas detection system includes an imager array adapted to image a scene, wherein the imager array comprises a plurality of sensor arrays, and wherein each sensor array comprises: a lens adapted to receive electromagnetic radiation from the scene, and a plurality of sensors adapted to capture an image of the scene based on the electromagnetic radiation received through the lens; wherein a first one of the sensor arrays is adapted to capture a first image of a first wavelength range of the electromagnetic radiation; wherein a second one of the sensor arrays is adapted to capture a second image of a second wavelength range of the electromagnetic radiation; and wherein the second wavelength range is a subset of the first wavelength range and substantially corresponds to an absorption band of a gas.

In accordance with another embodiment of the disclosure, a method of detecting gas includes receiving electromagnetic radiation from a scene at an imager array, wherein the imager array comprises a plurality of sensor arrays, and wherein each sensor array comprises a lens adapted to receive the electromagnetic radiation from the scene and a plurality of sensors adapted to capture an image of the scene based on the electromagnetic radiation received through the lens; capturing a first image of a first wavelength range of the electromagnetic radiation using a first one of the sensor arrays; and capturing a second image of a second wavelength range of the electromagnetic radiation using a second one of the sensor arrays, wherein the second wavelength range is a subset of the first wavelength range and substantially corresponds to an absorption band of a gas.

In accordance with another embodiment of the disclosure, an imager calibration system includes an imager array adapted to image a scene, wherein the imager array comprises a plurality of sensor arrays, and wherein each sensor array comprises: a lens adapted to receive electromagnetic radiation from the scene, and a plurality of sensors adapted to capture an image of the scene based on the electromagnetic radiation received through the lens; and a processor adapted to: receive a plurality of pixel values associated with the images captured by the sensors of the sensor arrays, map the sensors to a coordinate space, wherein at least one sensor of each sensor array is mapped to each coordinate of the coordinate space, and calculate an offset correction term for each sensor based on the pixel values of all sensors mapped to the same coordinate.

In accordance with another embodiment of the disclosure, a method of calibrating an imaging system includes receiving electromagnetic radiation from a scene at an imager array, wherein the imager array comprises a plurality of sensor arrays, and wherein each sensor array comprises a lens adapted to receive the electromagnetic radiation from the scene and a plurality of sensors adapted to capture an image of the scene based on the electromagnetic radiation received through the lens; receiving a plurality of pixel values associated with the images captured by the sensors of the sensor arrays; mapping the sensors to a coordinate space, wherein at least one sensor of each sensor array is mapped to each coordinate of the coordinate space; and calculating an offset correction term for each sensor based on the pixel values of all sensors mapped to the same coordinate.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
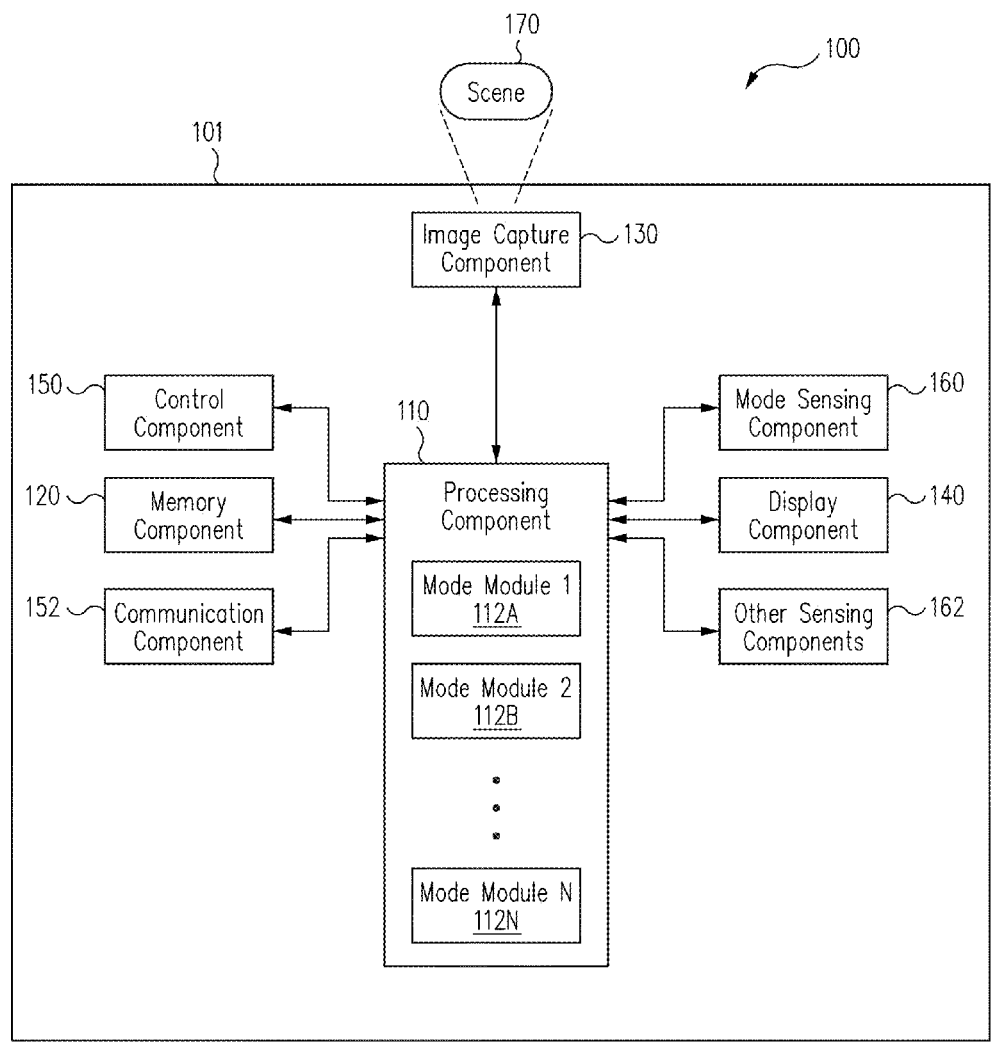
FIG. 1 illustrates a block diagram of an imaging system in accordance with an embodiment of the disclosure.

FIG. 1 illustrates a block diagram of an imaging system 100 in accordance with an embodiment of the disclosure. Imaging system 100 may be used to capture and process images in accordance with various techniques described herein. As shown, various components of imaging system 100 may be provided in a housing 101, such as a housing of a camera or other system. In one embodiment, imaging system 100 includes a processing component 110, a memory component 120, an image capture component 130 (e.g., an imager array including a plurality of sensor arrays), a display component 140, a control component 150, and a mode sensing component 160. In another embodiment, imaging system 100 may also include a communication component 152 and one or more other sensing components 162.

In various embodiments, imaging system 100 may represent an imaging device, such as a camera, to capture images, for example, of a scene 170. Imaging system 100 may represent any type of camera system which, for example, detects electromagnetic radiation and provides representative data (e.g., one or more still images or video images). For example, imaging system 100 may represent a camera that is directed to detect one or more ranges of electromagnetic radiation and provide associated image data. Imaging system 100 may include a portable device and may be implemented, for example, as a handheld device and/or coupled, in other examples, to various types of vehicles (e.g., a land-based vehicle, a watercraft, an aircraft, a spacecraft, or other vehicle) or to various types of fixed locations (e.g., a home security mount, a campsite or outdoors mount, or other location) via one or more types of mounts. In still another example, imaging system 100 may be integrated as part of a non-mobile installation to provide images to be stored and/or displayed.

Processing component 110 includes, in one embodiment, a microprocessor, a single-core processor, a multi-core processor, a microcontroller, a logic device (e.g., a programmable logic device configured to perform processing functions), a digital signal processing (DSP) device, or any other type of generally known processor. Processing component 110 is adapted to interface and communicate with components 120, 130, 140, 150, 160, and 162 to perform method and processing steps as described herein. Processing component 110 may include one or more mode modules 112A-112N for operating in one or more modes of operation (e.g., to operate in accordance with any of the various embodiments disclosed herein). In one aspect, mode modules 112A-112N are adapted to define preset processing and/or display functions that may be embedded in processing component 110 or stored on memory component 120 for access and execution by processing component 110. In another aspect, processing component 110 may be adapted to perform various types of image processing algorithms as described herein.

In various embodiments, it should be appreciated that each mode module 112A-112N may be integrated in software and/or hardware as part of processing component 110, or code (e.g., software or configuration data) for each mode of operation associated with each mode module 112A-112N, which may be stored in memory component 120. Embodiments of mode modules 112A-112N (i.e., modes of operation) disclosed herein may be stored by a separate machine readable medium (e.g., a memory, such as a hard drive, a compact disk, a digital video disk, or a flash memory) to be executed by a computer (e.g., logic or processor-based system) to perform various methods disclosed herein.

In one example, the machine readable medium may be portable and/or located separate from imaging system 100, with stored mode modules 112A-112N provided to imaging system 100 by coupling the machine readable medium to imaging system 100 and/or by imaging system 100 downloading (e.g., via a wired or wireless link) the mode modules 112A-112N from the machine readable medium (e.g., containing the non-transitory information). In various embodiments, as described herein, mode modules 112A-112N provide for improved camera processing techniques for real time applications, wherein a user or operator may change the mode of operation depending on a particular application, such as a off-road application, a maritime application, an aircraft application, a space application, or other application.

Memory component 120 includes, in one embodiment, one or more memory devices to store data and information. The one or more memory devices may include various types of memory including volatile and non-volatile memory devices, such as RAM (Random Access Memory), ROM (Read-Only Memory), EEPROM (Electrically-Erasable Read-Only Memory), flash memory, or other types of memory. In one embodiment, processing component 110 is adapted to execute software stored in memory component 120 to perform various methods, processes, and modes of operations in manner as described herein.

Image capture component 130 includes, in one embodiment, one or more sensors (e.g., any type of detector, such as a focal plane array) for capturing image signals representative of an image, of scene 170. In one embodiment, the sensors of image capture component 130 provide for representing (e.g., converting) a captured image signal of scene 170 as digital data (e.g., via an analog-to-digital converter included as part of the sensor or separate from the sensor as part of imaging system 100). Processing component 110 may be adapted to receive image signals from image capture component 130, process image signals (e.g., to provide processed image data), store image signals or image data in memory component 120, and/or retrieve stored image signals from memory component 120. Processing component 110 may be adapted to process image signals stored in memory component 120 to provide image data (e.g., captured and/or processed image data) to display component 140 for viewing by a user.

Display component 140 includes, in one embodiment, an image display device (e.g., a liquid crystal display (LCD)) or various other types of generally known video displays or monitors. Processing component 110 may be adapted to display image data and information on display component 140. Processing component 110 may be adapted to retrieve image data and information from memory component 120 and display any retrieved image data and information on display component 140. Display component 140 may include display electronics, which may be utilized by processing component 110 to display image data and information. Display component 140 may receive image data and information directly from image capture component 130 via processing component 110, or the image data and information may be transferred from memory component 120 via processing component 110.

In one embodiment, processing component 110 may initially process a captured image and present a processed image in one mode, corresponding to mode modules 112A-112N, and then upon user input to control component 150, processing component 110 may switch the current mode to a different mode for viewing the processed image on display component 140 in the different mode. This switching may be referred to as applying the camera processing techniques of mode modules 112A-112N for real time applications, wherein a user or operator may change the mode while viewing an image on display component 140 based on user input to control component 150. In various aspects, display component 140 may be remotely positioned, and processing component 110 may be adapted to remotely display image data and information on display component 140 via wired or wireless communication with display component 140, as described herein.

Control component 150 includes, in one embodiment, a user input and/or interface device having one or more user actuated components, such as one or more push buttons, slide bars, rotatable knobs or a keyboard, that are adapted to generate one or more user actuated input control signals. Control component 150 may be adapted to be integrated as part of display component 140 to function as both a user input device and a display device, such as, for example, a touch screen device adapted to receive input signals from a user touching different parts of the display screen. Processing component 110 may be adapted to sense control input signals from control component 150 and respond to any sensed control input signals received therefrom.

Control component 150 may include, in one embodiment, a control panel unit (e.g., a wired or wireless handheld control unit) having one or more user-activated mechanisms (e.g., buttons, knobs, sliders, or others) adapted to interface with a user and receive user input control signals. In various embodiments, the one or more user-activated mechanisms of the control panel unit may be utilized to select between the various modes of operation, as described herein in reference to mode modules 112A-112N. In other embodiments, it should be appreciated that the control panel unit may be adapted to include one or more other user-activated mechanisms to provide various other control functions of imaging system 100, such as auto-focus, menu enable and selection, field of view (FoV), brightness, contrast, gain, offset, spatial, temporal, and/or various other features and/or parameters. In still other embodiments, a variable gain signal may be adjusted by the user or operator based on a selected mode of operation.

In another embodiment, control component 150 may include a graphical user interface (GUI), which may be integrated as part of display component 140 (e.g., a user actuated touch screen), having one or more images of the user-activated mechanisms (e.g., buttons, knobs, sliders, or others), which are adapted to interface with a user and receive user input control signals via the display component 140. As an example for one or more embodiments as discussed further herein, display component 140 and control component 150 may represent a smart phone, a tablet, a personal digital assistant (e.g., a wireless, mobile device), a laptop computer, a desktop computer, or other type of device.

Mode sensing component 160 includes, in one embodiment, an application sensor adapted to automatically sense a mode of operation, depending on the sensed application (e.g., intended use or implementation), and provide related information to processing component 110. In various embodiments, the application sensor may include a mechanical triggering mechanism (e.g., a clamp, clip, hook, switch, push-button, or others), an electronic triggering mechanism (e.g., an electronic switch, push-button, electrical signal, electrical connection, or others), an electro-mechanical triggering mechanism, an electro-magnetic triggering mechanism, or some combination thereof. For example for one or more embodiments, mode sensing component 160 senses a mode of operation corresponding to the imaging system's 100 intended application based on the type of mount (e.g., accessory or fixture) to which a user has coupled the imaging system 100 (e.g., image capture component 130). Alternatively, the mode of operation may be provided via control component 150 by a user of imaging system 100 (e.g., wirelessly via display component 140 having a touch screen or other user input representing control component 150).

Furthermore in accordance with one or more embodiments, default mode of operation may be provided, such as for example when mode sensing component 160 does not sense a particular mode of operation (e.g., no mount sensed or user selection provided). For example, imaging system 100 may be used in a freeform mode (e.g., handheld with no mount) and the default mode of operation may be set to handheld operation, with the images provided wirelessly to a wireless display (e.g., another handheld device with a display, such as a smart phone, or to a vehicle's display).

Mode sensing component 160, in one embodiment, may include a mechanical locking mechanism adapted to secure the imaging system 100 to a vehicle or part thereof and may include a sensor adapted to provide a sensing signal to processing component 110 when the imaging system 100 is mounted and/or secured to the vehicle. Mode sensing component 160, in one embodiment, may be adapted to receive an electrical signal and/or sense an electrical connection type and/or mechanical mount type and provide a sensing signal to processing component 110. Alternatively or in addition, as discussed herein for one or more embodiments, a user may provide a user input via control component 150 (e.g., a wireless touch screen of display component 140) to designate the desired mode (e.g., application) of imaging system 100.

Processing component 110 may be adapted to communicate with mode sensing component 160 (e.g., by receiving sensor information from mode sensing component 160) and image capture component 130 (e.g., by receiving data and information from image capture component 130 and providing and/or receiving command, control, and/or other information to and/or from other components of imaging system 100).

In various embodiments, mode sensing component 160 may be adapted to provide data and information relating to system applications including a handheld implementation and/or coupling implementation associated with various types of vehicles (e.g., a land-based vehicle, a watercraft, an aircraft, a spacecraft, or other vehicle) or stationary applications (e.g., a fixed location, such as on a structure). In one embodiment, mode sensing component 160 may include communication devices that relay information to processing component 110 via wireless communication. For example, mode sensing component 160 may be adapted to receive and/or provide information through a satellite, through a local broadcast transmission (e.g., radio frequency), through a mobile or cellular network and/or through information beacons in an infrastructure (e.g., a transportation or highway information beacon infrastructure) or various other wired or wireless techniques (e.g., using various local area or wide area wireless standards).

In another embodiment, image capturing system 100 may include one or more other types of sensing components 162, including environmental and/or operational sensors, depending on the sensed application or implementation, which provide information to processing component 110 (e.g., by receiving sensor information from each sensing component 162). In various embodiments, other sensing components 162 may be adapted to provide data and information related to environmental conditions, such as internal and/or external temperature conditions, lighting conditions (e.g., day, night, dusk, and/or dawn), humidity levels, specific weather conditions (e.g., sun, rain, and/or snow), distance (e.g., laser rangefinder), and/or whether a tunnel, a covered parking garage, or that some type of enclosure has been entered or exited. Accordingly, other sensing components 160 may include one or more conventional sensors as would be known by those skilled in the art for monitoring various conditions (e.g., environmental conditions) that may have an affect (e.g., on the image appearance) on the data provided by image capture component 130.

In some embodiments, other sensing components 162 may include devices that relay information to processing component 110 via wireless communication. For example, each sensing component 162 may be adapted to receive information from a satellite, through a local broadcast (e.g., radio frequency) transmission, through a mobile or cellular network and/or through information beacons in an infrastructure (e.g., a transportation or highway information beacon infrastructure) or various other wired or wireless techniques.

In various embodiments, components of image capturing system 100 may be combined and/or implemented or not, as desired or depending on application requirements, with image capturing system 100 representing various functional blocks of a system. For example, processing component 110 may be combined with memory component 120, image capture component 130, display component 140, and/or mode sensing component 160. In another example, processing component 110 may be combined with image capture component 130 with only certain functions of processing component 110 performed by circuitry (e.g., a processor, a microprocessor, a microcontroller, a logic device, or other circuitry) within image capture component 130. In still another example, control component 150 may be combined with one or more other components or be remotely connected to at least one other component, such as processing component 110, via a wired or wireless control device so as to provide control signals thereto.

In one embodiment, image capturing system 100, may include a communication component 152, such as a network interface component (NIC) adapted for communication with a network including other devices in the network. In various embodiments, communication component 152 may include a wireless communication component, such as a wireless local area network (WLAN) component based on the IEEE 802.11 standards, a wireless broadband component, mobile cellular component, a wireless satellite component, or various other types of wireless communication components including radio frequency (RF), microwave frequency (MWF), and/or infrared frequency (IRF) components adapted for communication with a network. As such, communication component 152 may include an antenna coupled thereto for wireless communication purposes. In other embodiments, the communication component 152 may be adapted to interface with a DSL (e.g., Digital Subscriber Line) modem, a PSTN (Public Switched Telephone Network) modem, an Ethernet device, and/or various other types of wired and/or wireless network communication devices adapted for communication with a network.

In various embodiments, a network may be implemented as a single network or a combination of multiple networks. For example, in various embodiments, the network may include the Internet and/or one or more intranets, landline networks, wireless networks, and/or other appropriate types of communication networks. In another example, the network may include a wireless telecommunications network (e.g., cellular phone network) adapted to communicate with other communication networks, such as the Internet. As such, in various embodiments, the imaging system 100 may be associated with a particular network link such as for example a URL (Uniform Resource Locator), an IP (Internet Protocol) address, and/or a mobile phone number.

Figure 2A:
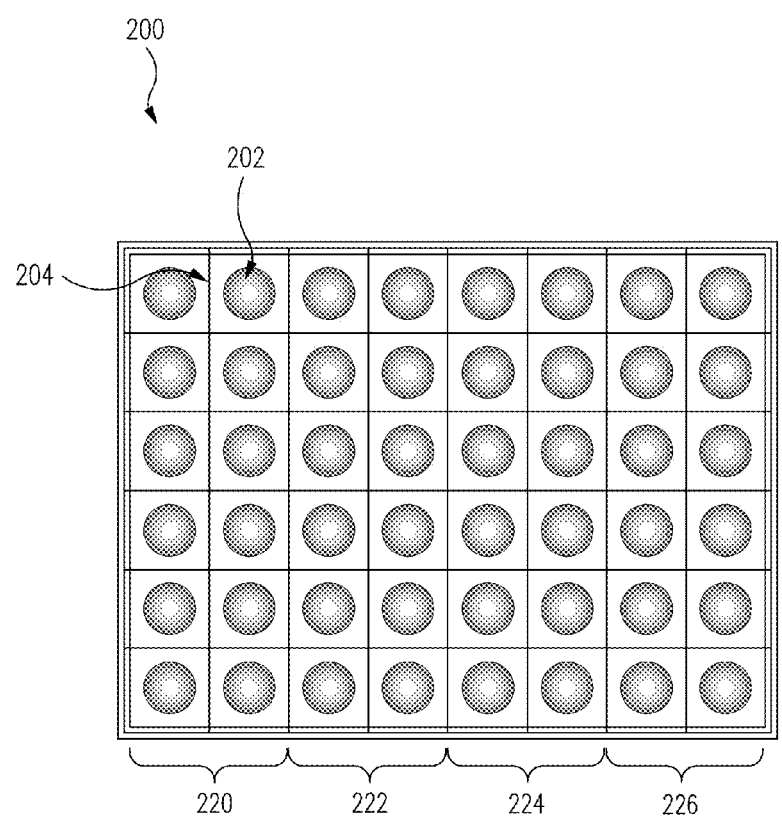
FIGS. 2A-B illustrate several views of an imager array having a plurality of sensor arrays of substantially equal size in accordance with embodiments of the disclosure.
Figure 2B:
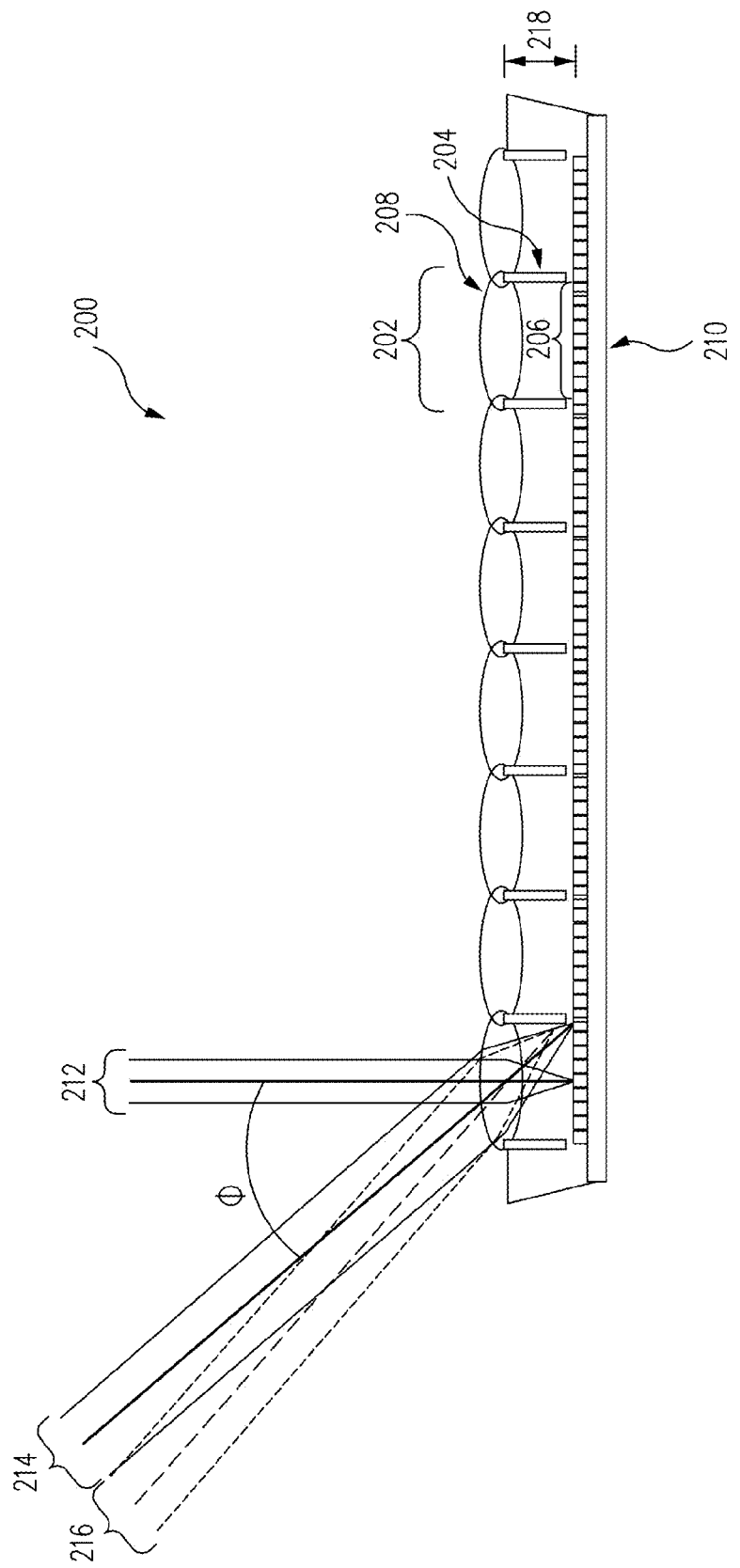

FIGS. 2A-B illustrate several views of an imager array 200 in accordance with embodiments of the disclosure. Imager array 200 may be used, for example, to implement image capture component 130 of imaging system 100.

As shown in the top view of FIG. 2A, imager array 200 may include an array (e.g., 8 by 6 in one embodiment) of sensor arrays 202 (e.g., also referred to as lenslets or optical elements). Although 48 sensor arrays 202 are shown in FIG. 2A, any desired number of sensor arrays 202 may be used in other embodiments. When implemented in imager array 200, sensor arrays 202 may be of substantially equal size.

As shown in the profile view of FIG. 2B, each sensor array 202 may include a plurality of sensors 206 (e.g., also referred to as pixels, elements, and sensor elements) and an associated lens 208. In one embodiment, sensors 206 may be implemented as uncooled microbolometer sensors, InGaAs sensors, or other types of sensors. In one embodiment, different sensor arrays 202 may share a common aperture through the use of a beam splitter. Sensors 206 may be provided, for example, on a base 210. In one embodiment, each sensor array 202 may include an array (e.g., 80 by 80 in one embodiment) of sensors 206. Any desired number of sensors 206 may be used in other embodiments. In one embodiment, all sensors 206 of imager array 200 may collectively provide 640 columns and 480 rows of pixels. In one embodiment, imager array 200 may include one or more read out integrated circuits (ROICs) to provide detected signals for processing and display.

Lenses 208 may be positioned in front of sensors 206 and separated by a distance 218. Lenses 208 may be transmissive with an appropriate refractive index for wavebands (e.g., wavelength ranges) of electromagnetic radiation (e.g., irradiation) to be captured by sensors 206. In one embodiment, lenses 208 may be implemented with optics of F#1. Advantageously, by using a plurality of lenses 208 with imager array 200 (e.g., rather than a single lens for all of imager array 200), the focal length, associated volume of imager array 200, and optics size may permit a camera or other imaging system 100 to be reduced in size (e.g., by an order of magnitude in one embodiment). As a result, imager array 200 may be implemented as a compact, lightweight device in comparison with larger heavier conventional imagers. The small size of imager array 200 may also permit multiple imager arrays 200 to be placed in close proximity to each other if desired.

Sensor arrays 202 may be oriented, for example, substantially in a plane facing the same direction. For distant objects (e.g., greater than 50 m in one embodiment), each sensor array 202 may image the same cone in space, and thus may capture images of the same scene 170 with negligible parallax. Such images may be processed by appropriate components of imaging system 100 in accordance with various techniques to provide images of electromagnetic radiation. In one embodiment, sensor arrays 202 may be placed in close proximity to each other by, for example, side-by-side placement or arranged for per-pixel filtering with associated RGB patterns, or other patterns.

In one embodiment, a high resolution (e.g., super resolved) image may be provided by processing images captured by multiple sensor arrays 202. In this regard, there may be some known phase shift between the various sensor arrays 202. In one embodiment, the optical resolution provided by lenses at the chosen aperture (e.g., the diffraction limit) 208 may be higher than the sampling resolution of sensor arrays 202.

In one embodiment, 202 a manufacturing process for sensor arrays 202 may result in random pointing differences for the image cones of sensor arrays 202. In another embodiment, a high precision manufacturing process for sensor arrays 202 may permit exact relative pointing differences to be realized. In either embodiment, the final per pixel phase shift between images (e.g., also referred to as framelets) captured by sensor arrays 202 may be measured by imaging system 100 using appropriate techniques.

By applying different high, low, or bandpass wavelength filters to sensor arrays 202, for example with different coating techniques and/or filters, an effect similar to a Bayer pattern can be achieved. The majority of sensor arrays 202 may be manufactured such that they allow transmission of irradiance over a wide spectral band so that when combined to a single image they achieve the highest spatial resolution for the most irradiance sensitive sensor arrays 202. Bandpass filtered sensor arrays 202 may also be read out at a lower frame rate allowing for longer integration times for narrow wavebands and low irradiance pixels, thus providing high resolution and high sensitivity multispectral imaging (e.g., for mid wave infrared imaging or other wavebands).

Sensors 206 may be separated from each other by a plurality of partitions 204 provided, for example, in grid form. In one embodiment, partitions 204 may be opaque for the effective wavebands of sensors 206. As such, partitions 204 may block electromagnetic radiation outside a desired FoV of sensors 206. In this regard, as shown in FIG. 2B, electromagnetic radiation 212 and 214 passing through an angle $\phi$ (e.g., the half angle of the FoV) may be received by sensors 206, but electromagnetic radiation 216 is blocked by partitions 204 and is not received by sensors 206. The implementation of partitions 204 in this manner may prevent out of field objects from being imaged on adjacent sensor arrays 202. In another embodiment, custom sensors may allow for spatial separation of sensor arrays 202 such that out of field irradiance does not affect the neighboring sensor arrays 202.

Partitions 204 may also provide structural support for lenses 208, especially in embodiments where imager array 200 is implemented as a vacuum package while lenses 208 provide the window for the vacuum package and receive stress associated therewith. In one embodiment, each associated group of sensors 206 and lens 208 in combination with its associated partitions 204 may effectively form a cube-like structure having dimensions of approximately 2 mm by 2 mm by 2 mm.

In one embodiment, imager array 200 may be implemented as a vacuum package with lenses 208 effectively providing both the window for the vacuum package as well as the optics for the entire imaging system 100. As a result, a complete camera or other type of imaging system may be manufactured with fewer production steps and conventional cameras with separate optics. Moreover, the close proximity of lenses 208 to sensors 206 may permit the overall vacuum volume to be kept comparable to conventional uncooled sensors with no need for additional optics.

In various embodiments, sensor arrays 202 may perform multi spectral imaging to selectively detect desired ranges of electromagnetic radiation (e.g., wavebands), such as thermal radiation, long wave infrared (LWIR) radiation, mid wave infrared (MWIR) radiation, short wave infrared (SWIR) radiation, near infrared (NIR) radiation, visible light (VIS), and/or other ranges. In this regard, lenses 208 may include appropriate coatings, or sensor arrays 202 may be provided with appropriate filters, to filter the electromagnetic radiation received by sensors 206. As a result, different sensor arrays 202 may detect different broad or narrow bands of electromagnetic radiation. In one embodiment, at least five spectral bands may be detected (e.g., ranging from visible light to LWIR, or other ranges).

For example, in one embodiment, a group 220 of sensor arrays 202 may include filters to detect red visible light, a group 222 of sensor arrays 202 may include filters to detect green visible light, a group 224 of sensor arrays 202 may include filters to detect blue visible light (e.g., groups 220, 222, and 224 may provide RGB patterns), and a group 226 of sensor arrays 202 may include filters to detect NIR/SWIR radiation (e.g., approximately 700-1700 nm). Other configurations, groupings, and detection ranges may be provided in other embodiments. For example, different sensor arrays 202 may use different types of sensors 206 to detect different wavebands (e.g., InGaAs sensors may be used to detect VIS-SWIR wavebands, and bolometer sensors may be used to detect MWIR-LWIR wavebands).

Multi spectral imaging may have dramatic advantages over single waveband imaging, and may be used in a variety of different applications such as geo sensing, target detection, target, classification, and target tracking using multiple sensor arrays 202 for improved capabilities and performance. By processing images from different combinations of wavebands and different phase shifted sensor arrays 202, images may be created that provide reasonable spatial resolution, excellent low light performance, and multi-spectral information about scene 170.

Wavebands from NIR to LWIR may show very different properties and are more or less suited for a specific imaging applications under specific environmental conditions. Factors such as vapor content in atmosphere, particle sizes in dust or aerosols, and scene dynamic range might render a MWIR sensor array useless but have no or only very limited effect on a NIR or LWIR sensor array. In addition, specific materials may have specific spectral signatures. By capturing a scene using multiple wavebands, the response profile can be compared to a database of normalized known spectral responses. As a result, imaging system 100 may attempt to classify the material.

Table 1 identifies various parameters of imaging array 200 in an embodiment configured to operate in the LWIR waveband.

TABLE 1

| Property | Value |
| --- | --- |
| Imaging array | 48 sensor arrays arranged in 8 by 6 matrix |
| Imaging array size | 16 mm by 12 mm |
| Sensor array | 6400 sensors in 80 by 80 matrix |
| Sensor array size | 2 mm by 2 mm |
| Sensor pitch | 25 μm |
| Focal length | 2.5 mm |
| F-number | 1.25 |
| Normalized wave length | 10 μm |
| Effective FoV | 44° |
| Airy disc diameter | 1.22 pixels (first minima) |

Table 2 identifies various parameters of imaging array 200 in an embodiment configured to operate in the VIS-NIR waveband (e.g., using InGaAs sensors capable of performing extended detection into the visible waveband down to, for example, 350 nm).

TABLE 2

| Property | Value |
| --- | --- |
| Imaging array | 48 sensor arrays arranged in 8 by 6 matrix |
| Imaging array size | 16 mm by 12 mm |
| Sensor array | 6400 sensors in 80 by 80 matrix |
| Sensor array size | 2 mm by 2 mm |
| Sensor pitch | 25 μm |
| Focal length | 4 mm |
| F-number | 2 |
| Normalized wave length | 1300 nm |
| Effective FoV | 28° |
| Airy disc diameter | 0.25 pixels (first minima) |

In one embodiment, sensor arrays 202 may exhibit reduced size in comparison to many existing imaging devices. For example, the use of filters or lens coatings at each sensor array 202 may permit desired wavebands spectra to be detected without requiring the use of large external optics or filter wheels, thus reducing size.

In one embodiment, individual sensor arrays 202 may be smaller than conventional image sensors. For example, in one example, an array of sensor arrays 202 may exhibit approximately the same surface area as a single conventional sensor array. By providing a lens 208 in each sensor array 202, such a configuration need not be diffraction limited in the manner of conventional high resolution sensors (e.g., greater than 640 by 480 pixel resolution) having small pitch sensor elements (e.g., less than 20 microns) where the spatial resolution of the optics may set the absolute diffraction limit for conventional sensors. In one embodiment, the diffraction limit may be set by the size of aperture.

The various features of imager array 200 may be used in a variety of applications to great advantage. For example, in one embodiment, imager array 200 may be modified to support foveal imaging.

Figure 2C:
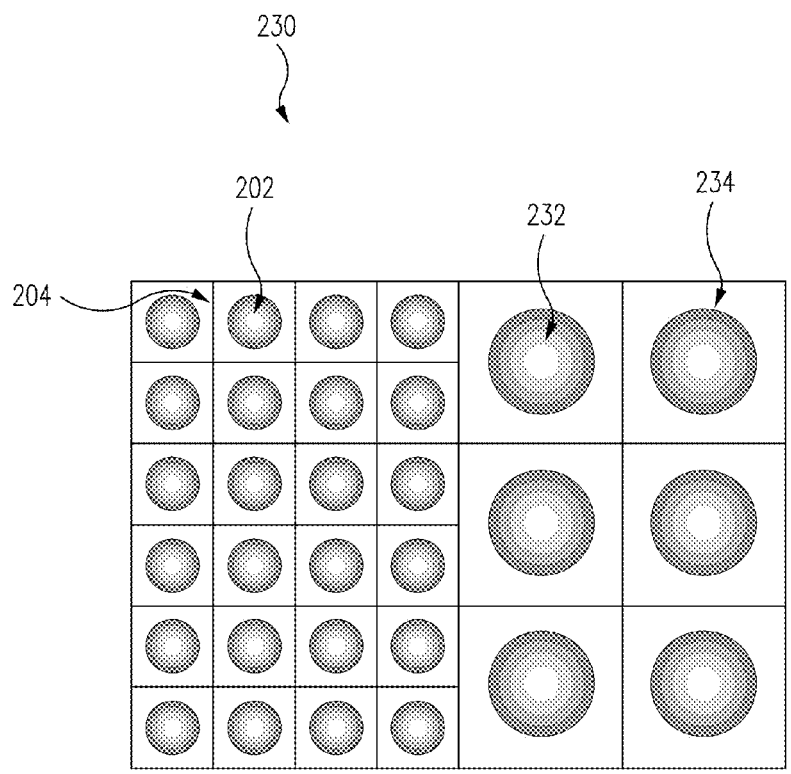
FIGS. 2C-D illustrate several views of an imager array having a plurality of sensor arrays of different sizes in accordance with embodiments of the disclosure.
Figure 2D:
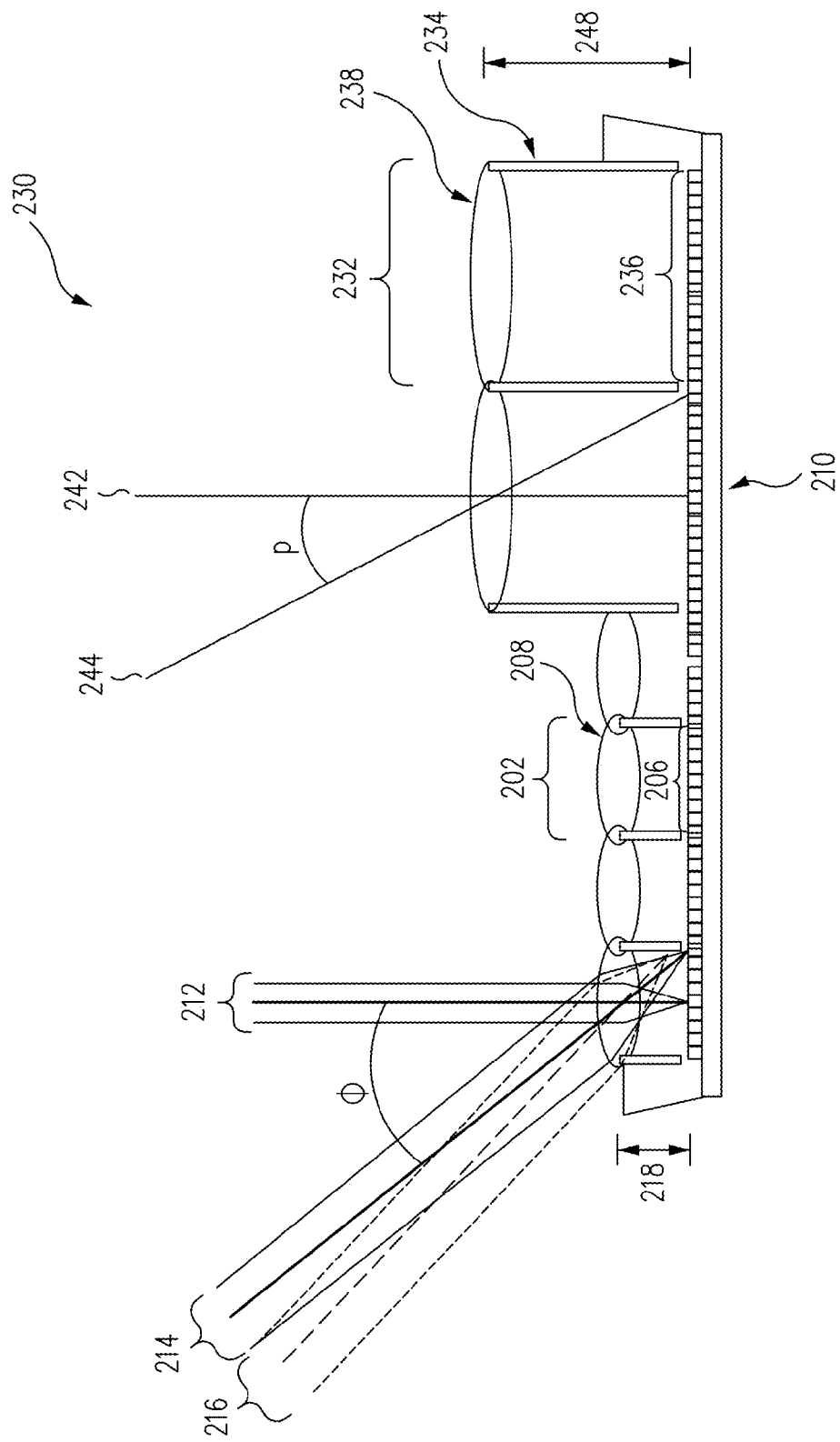

In this regard, FIGS. 2C-D illustrate several views of an imager array 230 in accordance with embodiments of the disclosure. Imager array 230 may be used, for example, to implement image capture component 130 of imaging system 100. Imager array 230 includes a plurality of sensor arrays 202 and 232 of different sizes and having different focal lengths. In this regard, in the higher frequency wavebands (e.g., VIS-SWIR), longer focal lengths may be used without the risk of being distortion limited by optics.

As shown in the top view of FIG. 2C, imager array 230 may include an array (e.g., 4 by 6 in one embodiment) of sensor arrays 202. Although 24 sensor arrays 202 are shown in FIG. 2C, any desired number of sensor arrays 202 may be used in other embodiments.

Imager array 230 may also include an array (e.g., 2 by 3 in one embodiment) of sensor arrays 232. Although 6 sensor arrays 232 are shown in FIG. 2C, any desired number of sensor arrays 232 may be used in other embodiments.

As shown in the profile view of FIG. 2D, each sensor array 232 may include a plurality of sensors 236 (e.g., also referred to as pixels) and an associated lens 238. In one embodiment, each sensor array 232 may include an array of sensors 236. Any desired number of sensors 236 may be used in various embodiments. Lenses 238 may be positioned in front of sensors 236 and separated by a distance 248.

As shown in FIG. 2D, distance 248 may be greater than distance 218. In this regard, sensor arrays 232 may exhibit a greater focal length than sensor arrays 202.

Sensor arrays 202 and 232 may be oriented, for example, substantially in a plane facing the same direction and configured to detect images from scene 170. Such images may be processed by appropriate components of imaging system 100 in accordance with various techniques to provide images of electromagnetic radiation.

Sensors 232 may be separated from each other by a plurality of partitions 234 provided, for example, in grid form. In one embodiment, partitions 234 may block electromagnetic radiation outside a desired FoV of sensors 234. In this regard, as shown in FIG. 2D, electromagnetic radiation 242 and 244 passing through an angle ρ (e.g., the half angle of the FoV) may be received by sensors 236, but electromagnetic radiation outside the FoV is blocked by partitions 234 and is not received by sensors 236.

In various embodiments, sensor arrays 202 and 232 may detect the same or different ranges of electromagnetic radiation. In this regard, lenses 208 and 238 may include the same or different coatings, or sensor arrays 202 and 232 may be provided with the same or different filters, to filter the electromagnetic radiation received by sensors 206 and 236.

As shown in FIG. 2D, sensor arrays 202 may exhibit a wider FoV (e.g., twice as large in one embodiment) than sensor arrays 232. Also, sensor arrays 232 may include a larger number of sensors 236 (e.g., four times as many in one embodiment) than the sensors 206 of sensor arrays 202.

As a result, sensor arrays 202 may capture images having a relatively wide FoV and relatively low resolution (e.g., to capture a low spatial frequency image). Such low resolution images may be provided, for example, to a remote observer as video images over a low bandwidth connection that may not be able to support the bandwidth associated with very high resolution images. In comparison, sensor arrays 232 may capture images having a relatively narrow FoV and relatively high resolution (e.g., to capture a high spatial frequency image). In this regard, sensor arrays 202 and 232 may be used to provide foveal imaging (e.g., to permit a human or machine observer to monitor a wide FoV image of scene 170 and also view a detailed, higher spatial resolution, narrow FoV image within scene 170).

For example, sensor arrays 202 and 232 may be implemented such that their optical centers approximately match each other. Thus, the narrow FoV images provided by sensor arrays 232 may provide a high spatial resolution sampling in the center of wide FoV images provided by sensor arrays 202 having a lower spatial resolution. Such an embodiment may permit foveal imaging in which a wide FoV image is captured (e.g., using sensor arrays 202) while a narrow Fov image is also captured (e.g., using sensor arrays 232) to permit fine spatial details of scene 170 to be resolved if desired.

In one embodiment, multiple sensor arrays 232 may be combined and mapped to provide an even higher spatial resolution grid in the center of the FoV. For example, four sensor arrays 232 may be combined into a single narrow FoV image with a sampling ratio four times higher than one of sensor arrays 232 alone.

Advantageously, the use of imaging array 230 to perform foveal imaging may avoid various limitations associated with conventional foveal imaging techniques including, for example, large aperture optics, high cost of manufacture, complexity (e.g., of multi FoV optics), parallax, or other limitations.

Although various references are made to imager array 200 and sensor arrays 202 in this disclosure with regard to various features, such features may be similarly provided by imager array 230 and sensor arrays 232 where appropriate.

In one embodiment, to minimize size, complexity, power consumption, and cost, sensors 206 may be implemented as uncooled microbolometer sensors for the LWIR waveband. Highpass filtering may be applied to signals provided by such sensors 206 to permit detection in the MWIR waveband for stable targets in scene 170 if used with lenses 208. In one embodiment, a large aperture (e.g., a low F#) may be used to receive sufficient MWIR radiation to perform imaging.

Figure 2E:
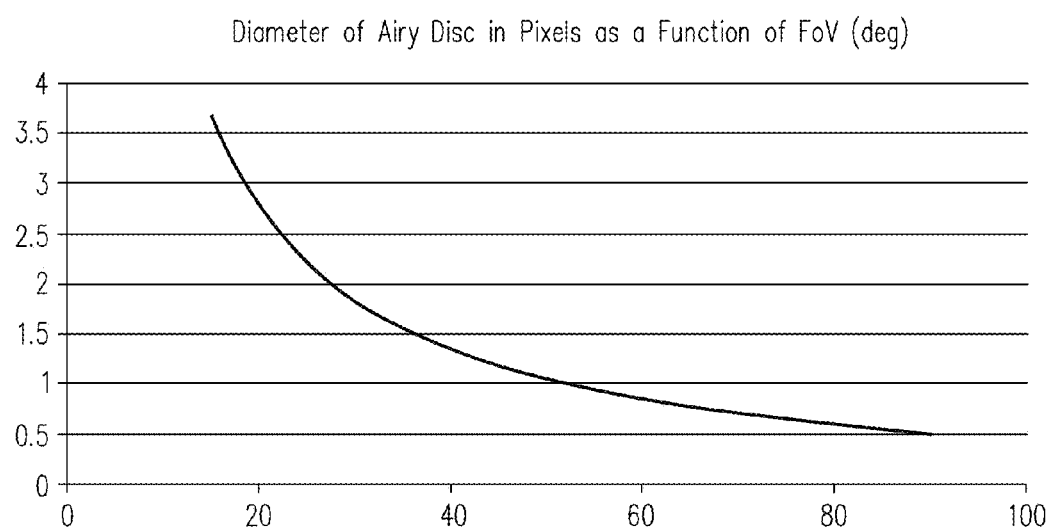
FIGS. 2E-F identify diameters of airy discs as a function of wavelength in accordance with embodiments of the disclosure.

When sensors 206 are implemented as LWIR sensors, the optical design and configuration of sensor arrays 202 may be diffraction limited. For example, FIG. 2E identifies diffraction limits for different fields of view in accordance with an embodiment of the disclosure. In FIG. 2E, sensor array 202 is implemented with an array of 80 by 80 sensors 206 with 25µ pitch as suggested by the diameter of the airy disc first minima. As shown, approximately 50 percent of the energy is contained within a circle half the size of the airy disc. In one embodiment, larger sensors 206 (e.g., pixels) may be desirable for improved sensitivity and may permit sensor arrays 202 exhibit optical resolution higher than sensor resolution (e.g., individual sensors 206 may undersample scene 170).

Figure 2F:
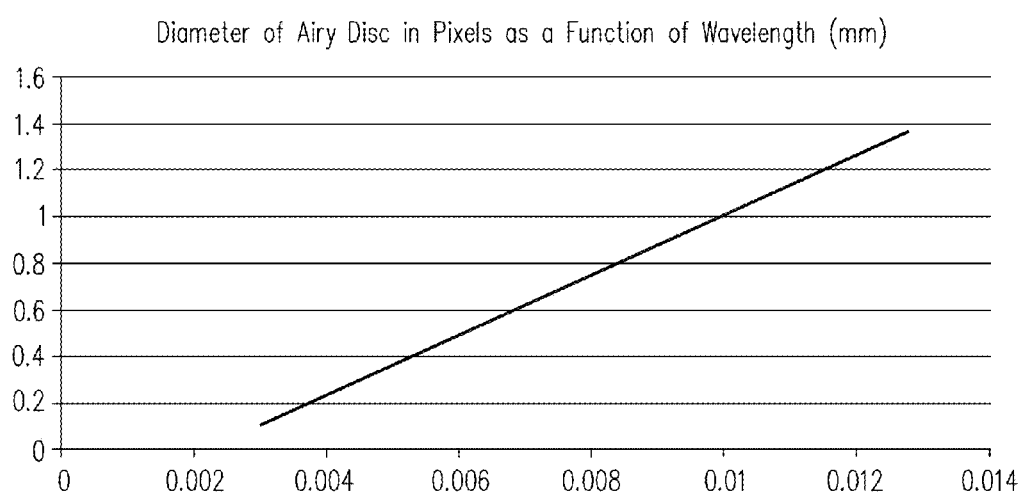

FIG. 2F identifies the size of an airy disc as a function of wavelength in accordance with an embodiment of the disclosure. In FIG. 2F, the size of the airy disc increases linearly with wave length (e.g., for optics with F# approximately equal to 1 and sensors 206 with 25µ pitch).

In another embodiment, imager array 200 may be used to provide images with a high signal to noise ratio (SNR). In this regard, conventional thermal imagers (e.g., particularly uncooled systems using microbolometers) often suffer from high spatial and temporal noise. Such noise may limit an imager's ability to detect small changes in irradiation.

Unfortunately, many conventional approaches to increasing the signal to noise ratio are impractical or overly complex. For example, one parameter that directly affects SNR is the amount of irradiance (e.g., the power of electromagnetic radiation per unit area at a surface) that can be absorbed per time unit. In a conventional microbolometer based imager, the surface area of the sensors may at least partly determine how much irradiance may be collected. However, increasing the size of individual sensors may result in fewer sensors being provided in the same size imager. Such an approach may result in drastically reduced spatial resolution (e.g., due to fewer sensors), reduced reliability (e.g., due to fewer sensors remaining in case of sensor failure), and higher costs (e.g., due to larger optics and the complexity of special sensor geometries).

As another example, larger aperture optics may be used to collect more irradiance per time unit to improve the SNR. However, such an approach may require larger optical elements that add weight and bulk material cost, and may require complicated manufacturing techniques.

As a further example, higher gain signal amplifiers may be used in the analog domain to improve the SNR. However, high gain may be difficult to achieve while still maintaining linearity. In addition, a high gain stage may limit the dynamic range of an imaging system because the limit of the analog to digital (A/D) converters may be reached at lower irradiance levels.

As yet another example, post processing of image data (e.g., the digitized signal) may improve the SNR. However, such processing may introduce unwanted artifacts such as blur, and may not always be able to separate noise from actual scene irradiance.

In contrast to such approaches, imager array 200 may provide improved SNR through the use of multiple sensor arrays 202 imaging approximately the same scene 170. In this regard, signals from multiple sensor arrays 202 may be combined to provide a virtual sensor image with a higher SNR than exhibited by the images provided by individual sensor arrays 202.

Figure 3:
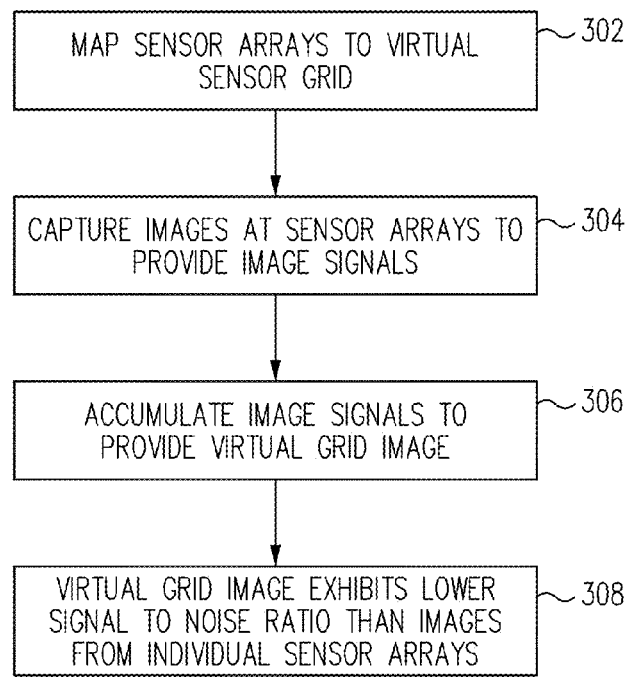
FIG. 3 illustrates a process of obtaining an image having a desirable signal to noise ratio in accordance with an embodiment of the disclosure.

For example, FIG. 3 illustrates a process of obtaining an image having a desirable signal to noise ratio in accordance with an embodiment of the disclosure. In block 302, sensors 206 of multiple sensor arrays 202 may be mapped to a virtual sensor grid (e.g., a set of pixels). Sensor arrays 202 may capture images of scene 170 (block 304).

By lowering the resolution of the virtual sensor grid, an improved SNR may be achieved that is approximately proportional to the amount of cumulative signal mapped to each location in the virtual sensor grid. For example, if the resolution of the virtual sensor grid is one quarter (¼) of the resolution of the entire imager array 200 in both the vertical and horizontal dimensions (e.g., the number of all sensors 206 in all sensor arrays 202 combined), then each pixel of the virtual sensor grid may accumulate signals from multiple sensor elements (block 306). For example, in one embodiment, each virtual sensor grid may accumulate signals from 16 sensor arrays 202). The resulting image (e.g., a result image) associated with the virtual sensor grid may exhibit a lower SNR than images from individual sensor arrays 202 (block 308). In this regard, if random noise has a zero mean, then the noise of the virtual sensor grid (e.g., having a lower resolution) may be one quarter of that of the actual signals from sensor arrays 202 (e.g., noise may be reduced as the square root of the number of samples).

By lowering the spatial and temporal noise in accordance with the process of FIG. 3, the detection range of imager array 200 may be improved. Such improvement may be particularly useful, for example, for surveillance cameras used in applications such as perimeter protection.

Figure 4:
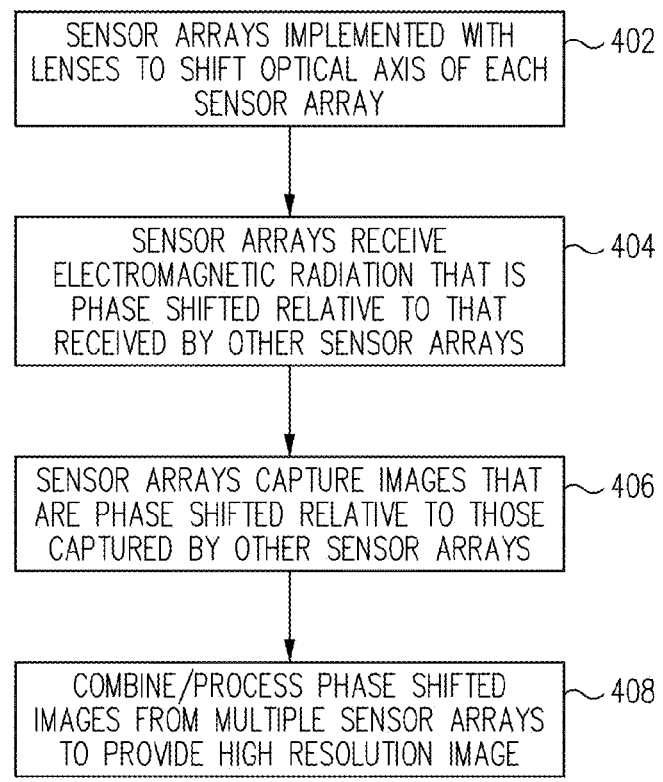
FIG. 4 illustrates a process of obtaining a high resolution image using phase shifts between sensor arrays in accordance with an embodiment of the disclosure.

In another embodiment, imager array 200 may be used to provide high resolution images by taking advantage of predetermined phase shifts between different sensor arrays 202. For example, FIG. 4 illustrates a process of obtaining a high resolution image using phase shifts between sensor arrays 202 in accordance with an embodiment of the disclosure. In one embodiment, the process of FIG. 4 may be implemented using super resolution processing techniques.

Intentional or unintentional production variations of the relative positions of sensors 206 and/or lenses 208 may cause different sensor arrays 202 to capture images from slightly different scenes 170 (e.g., non-identical locations resulting in phase shifts between images from different sensor arrays 202). Super resolution processing techniques may be used to combine phase shifted images from the different sensor arrays 202 into a single, super resolved, image. For example, in one embodiment, such super resolution processing may be used to combine and convert low resolution images of approximately 80 by 80 pixels up to high resolution images of approximately 320 by 240 pixels or close to the diffraction limit of the optics.

For example, in block 402 of FIG. 4, lenses 208 of different sensor arrays 202 may be slightly shifted relative to each other such that the center of the optical axis for each sensor array 202 slightly differs from other sensor arrays 202. In one embodiment, these differences in the optical axis (e.g., horizontal and vertical offsets) may be calibrated, measured, and determined for each sensor array 202 relative to a reference sensor array 200. Such operations may be performed, for example, at the time sensor arrays 202 are manufactured (e.g., thus eliminating the need for complex and error prone real time optical flow calculations). As a result, although sensor arrays 202 may be positioned to face the same scene 170, the electromagnetic radiation received by each sensor array 202 may be phase shifted (e.g., exhibiting a sub pixel phase shift) by a known amount relative to that received by other sensor arrays 202 (block 404). As a result, images captured by each sensor array 202 may be phase shifted relative to the images captured by other sensor arrays 202 (block 406).

Thus, by varying the alignment of the center of the optical axis for each sensor array 202, captured images may exhibit arbitrary sub pixel phase shifts. For distant scenes 170, parallax effects associated with the spatial separation in the image plane may be negligible.

The phase shifted images captured by multiple sensor arrays 202 may be combined and/or otherwise processed to provide a higher resolution image (e.g., a result image) than would otherwise be provided by the images captured by individual sensor arrays 202 (block 408).

Advantageously, by combining phase shifted images (e.g., on a per pixel level in one embodiment), a higher scene sampling rate may be achieved. In one embodiment, the optical resolution provided by lenses 208 may be higher than the sampling resolution of sensors 206. In this case, by combining phase shifted images from multiple sensor arrays 202 and applying an appropriate Wiener filter or other deconvolution method, the resulting image may exhibit a higher resolution (e.g., approximately two to three times higher in one embodiment) than that of images provided by individual sensor arrays 202. In one embodiment, the process of FIG. 4 may be performed automatically.

In one embodiment, the processes of FIGS. 3 and 4 may be combined to permit imaging system 100 to run in several different modes. For example, in one mode, a low resolution image with a low SNR may be provided in accordance with the process of FIG. 3. In another mode, a higher resolution image may be provided in accordance with the process of FIG. 4. In yet another mode, the processes of FIGS. 3 and 4 may be performed simultaneously (e.g., to provide different result images using different processes). Other processes provided in this disclosure may be combined where appropriate as may be desired in particular applications.

In another embodiment, imager array 200 may be used to provide stereo imaging (e.g., stereo vision). For example, FIG. 5 illustrates imager array 200 configured to provide stereo imaging in accordance with an embodiment of the disclosure.

As discussed, in certain embodiments (e.g., for objects at a distance greater than 50 m in one embodiment), parallax caused by the relative spacing between sensor arrays 202 may be negligible. However, in other embodiments, such parallax may be used to provide stereo (e.g., three dimensional) images of scene 170.

Figure 5:
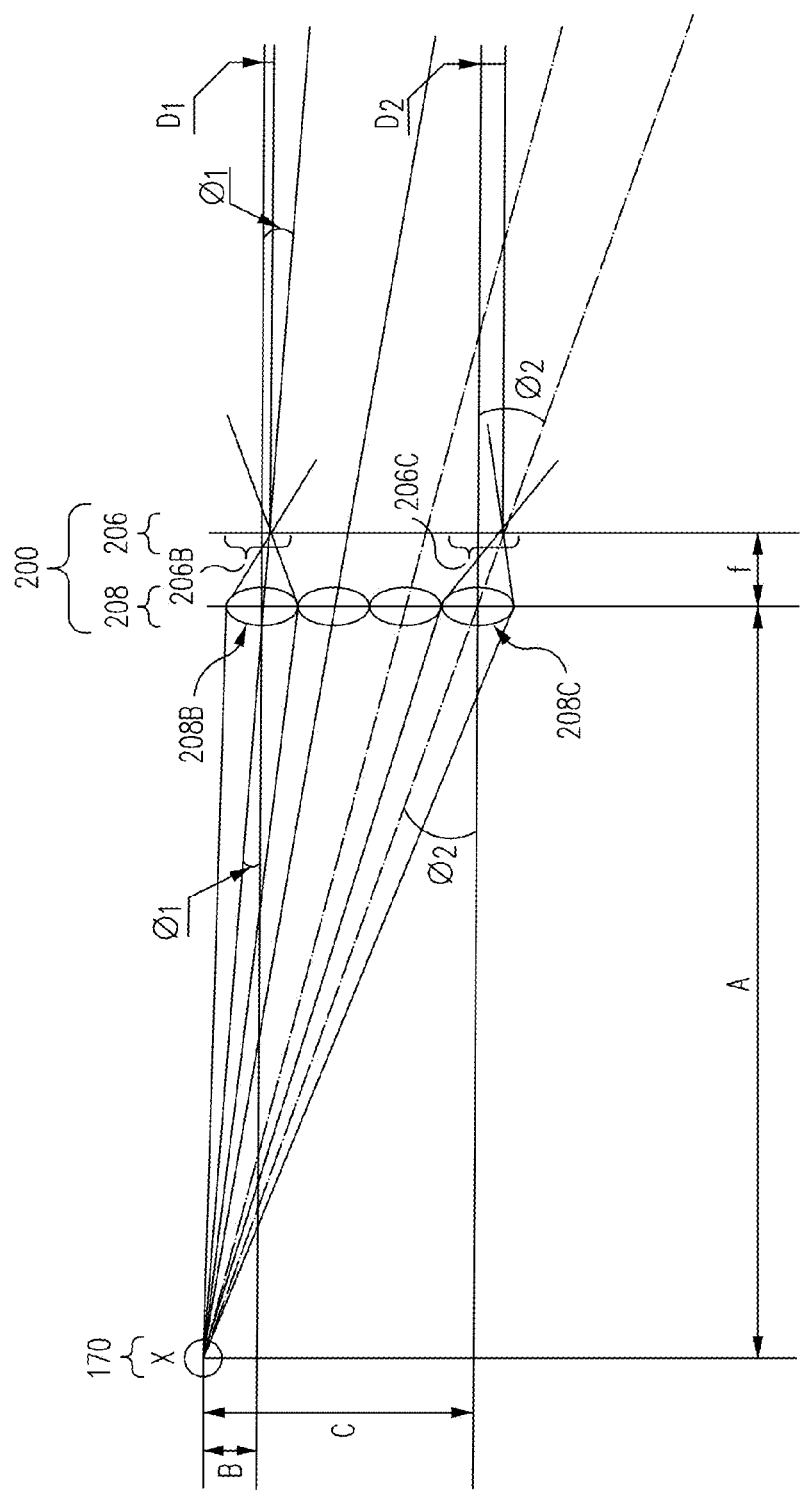
FIG. 5 illustrates an imager array configured to provide stereo imaging in accordance with an embodiment of the disclosure.

For example, in FIG. 5, an object X may be positioned in scene 170 at a short distance A (e.g., less than approximately 5 m in one embodiment) from imager array 200. Object X may be shifted relative to the optical axis of a lens 208B by a distance B, and shifted relative to the optical axis of a lens 208C by a distance C. In the embodiment shown in FIG. 5, lenses 208B and 208C may have a focal length of approximately 2 mm.

As shown in FIG. 5, electromagnetic radiation from object X may be received by lens 208B at an angle Ø1 relative to the optical axis of lens 208B, and received by lens 208C at a different angle Ø2 relative to the optical axis of lens 208C. As a result, when sensors 206B associated with lens 208B capture an image of scene 170, object X may be offset from the center of the image by a distance D1. However, when sensors 206C associated with lens 208C capture an image of scene 170, object X may be offset from the center of the image by a different distance D2.

In one embodiment, the different images provided by sensors 206B and 206C may be used to provide stereo vision, for example, in the form of realtime stereo video images or static stereo images. Such images provide a user with a three dimensional view of object X in scene 170.

Such stereo images may be used in a variety of applications. For example, imager array 200 may be provided in a thermal imaging cube for use in hazardous environments, such as by firefighters or other emergency personnel to provide three dimensional images of a hazardous environment. Such images may be transmitted wirelessly or by wire from the hazardous environment to safe locations for viewing.

In another embodiment, a plurality of sensor arrays 202 may be configured to detect images from electromagnetic radiation received through a plurality of apertures distributed over the outside surface of a device to provide a robust detector that may be thrown or otherwise introduced to a hazardous environment, such a smoke filled space. Such a device may be configured to wirelessly transmit images (e.g., infrared, multi-spectral, or other images) to a non-hazardous location to permit users to safely view the hazardous environment (e.g., in a 360 degree field of view).

In another embodiment, imager array 200 may be used to provide redundant sensor arrays 202 that permit imager array 200 to provide high quality images despite the presence of possible defects in one or more sensors 206. In this regard, modern high spatial resolution imaging devices are expensive, complex devices and may be subject to stringent manufacturing tolerances. Indeed, for many imaging devices, the imager (e.g., detector) may be the single most expensive component. Microbolometer thermal imaging micro-electro-mechanical systems (MEMS) devices with small dimensions (e.g., small pixel pitch) may have production parameters that are particularly difficult to meet consistently. Such production parameters may include, for example, clean room specifications, production equipment, process repeatability, raw material purity, manual handling of the completed parts, and other parameters. Variations on any of the production parameters may lead to decreased yields (e.g., due to defective devices) which increase the overall cost for each specification-compliant device.

For thermal imaging devices in particular, imperfections in production may result in any number of non operating sensors. For high resolution devices, for example devices with 640 by 480 sensors or more, it may be difficult to produce devices with 100 percent operability (e.g., wherein every pixel operates within specification under all operating conditions).

As a result, producers (e.g., manufacturers) of imaging devices may specify some maximum number of non operating pixels. For example, producers may set the permissible number of defective pixels to 0.1 percent of all pixels, or may limit the number of defective pixels in the center of the images to a small number, but permit larger numbers of defective pixels to be present in peripheral parts of the images. As another example, producers may limit the number of permissible serious defects, such as entirely defective rows or columns. In particular, it may be difficult to replace values from two or more neighboring rows or columns. It is therefore typical for producers to reject or discard devices that include adjacent defective rows or columns or clusters of defective pixels.

Conventional corrective techniques are often ineffective for large clusters of defective pixels. Moreover, it is often impractical to reuse devices with defective pixels in other lower resolution products.

Figure 6A:
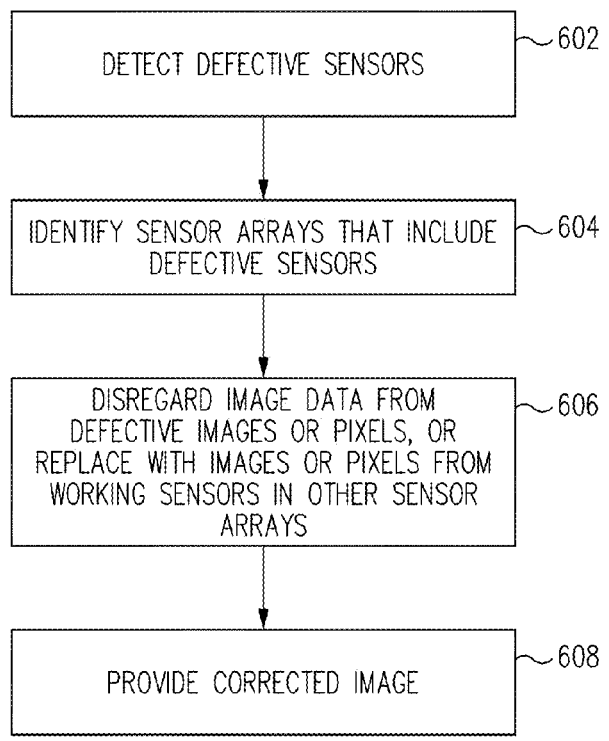
FIG. 6A illustrates a process of correcting defective pixels in an imager array in accordance with an embodiment of the disclosure.

FIG. 6A illustrates a process of correcting defective pixels (e.g., sensors 206) in imager array 200 in accordance with an embodiment of the disclosure. One or more defective sensors 206 may be detected (block 602), and the corresponding sensor arrays 202 of imager array 200 including the defective sensors 206 may be identified (block 604). In various embodiments, such detection and identification may be performed during the manufacture and testing of imager array 200, or during the subsequent operation of imager array 200 in the field.

Figure 6B:
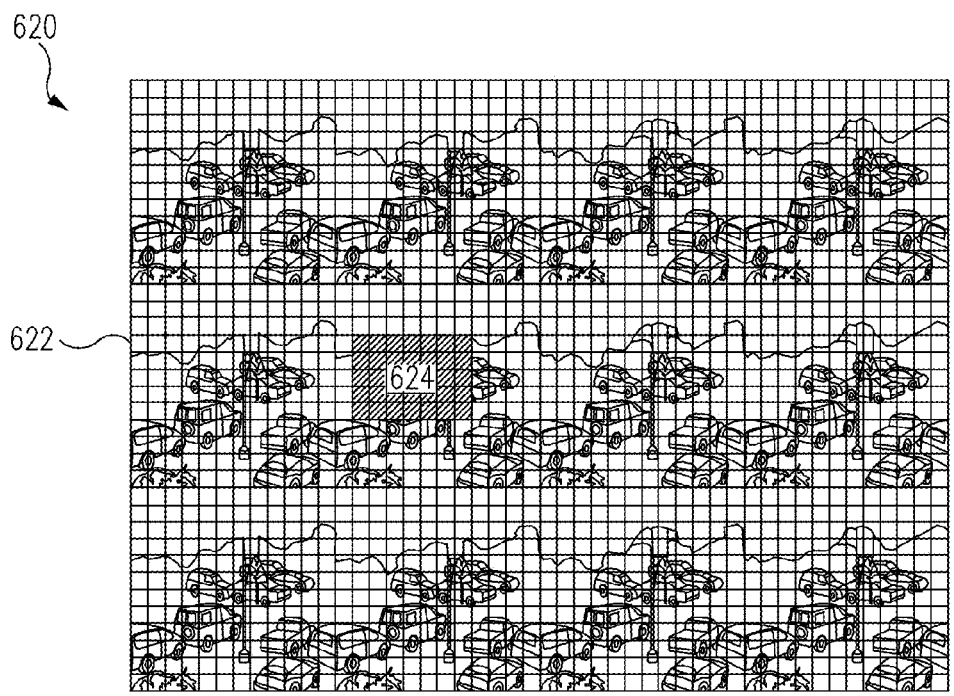
FIGS. 6B-C illustrate images with defective pixels in accordance with embodiments of the disclosure.
Figure 6C:
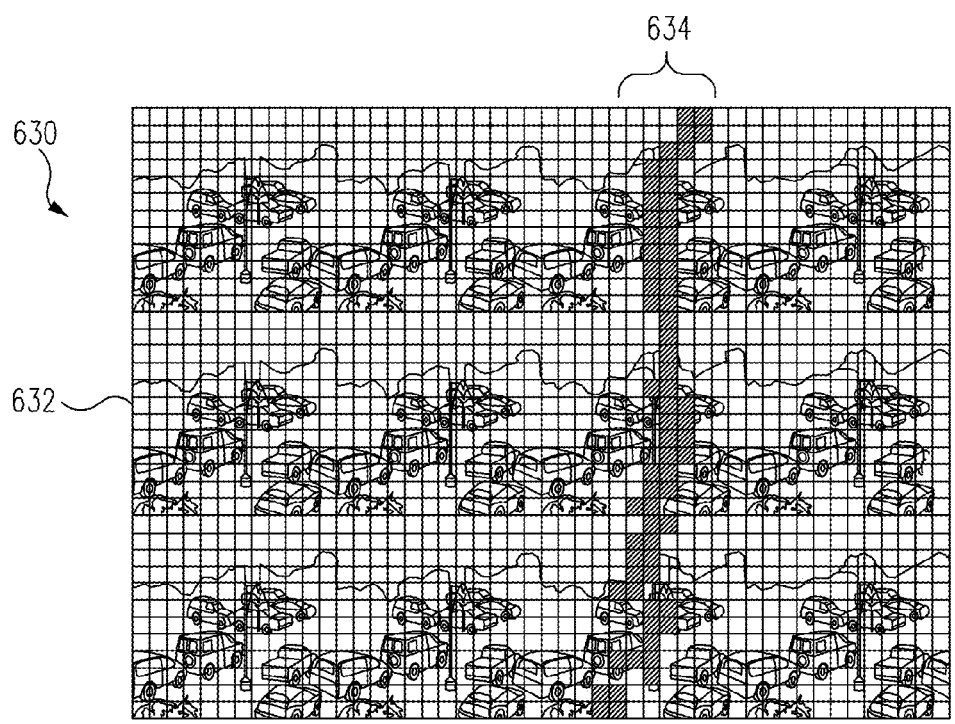

For example, FIGS. 6B and 6C illustrate sets 620 and 630 of various images 622 and 632, respectively, captured by 12 sensor arrays 202 (e.g., a subset of sensor arrays 202). As shown in FIG. 6B, one of images 622 includes a cluster of defective pixels 624 which largely obscure the information shown by the defective image. In this regard, a cluster of sensors 206 in one of sensor arrays 202 are defective and fail to provide useable image data of the captured scene. As also shown in FIG. 6B, the remaining eleven images 622 do not include defective pixels and are provided by sensor arrays 202 with working sensors 206.

In FIG. 6C, three of images 632 include various clusters of defective pixels 634 which span multiple rows and columns, and largely obscure the information shown by the three defective images. As also shown in FIG. 6C, the remaining nine images 632 do not include defective pixels and are provided by sensor arrays 202 with working sensors 206.

Advantageously, sensor arrays 202 may capture at least partially redundant images of the same scene 170. As a result, imaging system 100 may disregard the defective images provided by sensor arrays 202 with defective sensors 206, or correct the defective images or pixels with appropriate image data from working sensors 206 in other sensor arrays 202 (block 606). As a result, imaging system 100 may provide a corrected image (e.g., a result image) that includes all defective pixels filled in with appropriate image data (block 608).

Moreover, in embodiments where different sensor arrays 202 exhibit slightly different optical alignment and local distortion, images provided by different sensor arrays 202 may not be entirely identical. Such differences may permit interpolation techniques to be used to correct the defective image data.

In another embodiment, imager array 200 may be calibrated without the use of a shutter. Infrared cameras in the MWIR and LWIR wavebands are sensitive to thermal radiation. Unlike a visible spectrum camera that may be built such that visible light may only enter through the optics, a thermal camera may generate infrared radiation from sources inside the thermal camera. For example, electronics may generate significant amounts of infrared radiation (e.g., irradiance). Unfortunately, these sources of irradiation that are not from the scene to be imaged may nevertheless be measured by infrared camera sensors (e.g., infrared radiation from a heat source inside the thermal camera may reflect off surfaces inside the imager and end up detected by the infrared camera sensors.

One conventional approach to compensate for such internal infrared radiation in cooled and uncooled thermal imagers is to perform flat field correction (FFC). In this regard, detection of the scene may be temporarily blocked by inserting an opaque object (e.g., a shutter) in the optical path (e.g., assuming that signals measured by the sensors while the optical path is blocked stay constant or nearly constant). By measuring signals detected by the sensors while the optical path is blocked (e.g., fixed pattern noise (FPN)), and subtracting such signals from signals detected while the optical path is not blocked, images may be provided that include only scene information.

Unfortunately, such a conventional approach typically involves the use of a moving shutter which may add complexity and cost to an imaging system, and may compromise reliability. Moreover, calibration performed with a shutter may temporarily render an imaging system blind to the scene. In addition, a single shutter with a constant, uniform temperature does not allow for gain calibration (e.g., offset correction only) which may result in image artifacts, especially for high dynamic range scenes.

Another approach to compensate for such internal infrared radiation is to perform signal processing, such as scene based non uniformity correction (SBNUC) processing that relies on comparisons between two or more video frames. If there is some frame to frame motion, either due to the imager moving relative to the scene or some object in the scene moving, the measured irradiance at one sensor element location may be compared to another sensor element location in another video frame. Under the assumption that the scene irradiance stays constant, it is expected that all sensor elements should measure the same irradiance level for a given point in the scene. If different levels of irradiance are measured, this may be interpreted to be the result of out of field irradiance (e.g., FPN) corrupting the image.

Unfortunately, such SBNUC approaches generally require some frame to frame motion that is known to some degree of accuracy. For example, motion may be image based (e.g., calculated based on the scene information) or non image based (e.g., calculated based on an external motion sensor such as a MEMS gyroscope). Unfortunately, image based motion estimation approaches tend to fail when the scene dynamic range is small and/or the amount of FPN is large (e.g., where the SNR is poor). Non image based motion estimation approaches tend to fail when there is scene deformation or intra scene motion (e.g., a person or car moving relative to the scene).

Imager array 200 may be calibrated using several alternatives to the above approaches. For example, sensor arrays 202 may capture multiple images of the same scene 170 simultaneously, or substantially simultaneously depending on the exact properties of sensors 206 and their associated ROICs.

For example, in an embodiment with 48 sensor arrays 202, 48 images of scene 170 may be captured substantially simultaneously. During optics characterization, it can be exactly determined which sensors 206 in each sensor array 202 correspond to sensors 206 in other sensor arrays 202. The mean or median value of independent signals (e.g., data) detected by the corresponding sensors 206 (e.g., corresponding to a single point in the scene) may be used to correct all the corresponding sensors 206. Such an approach may be used in arbitrarily poor SNR conditions, does not require imager or scene motion, does not require moving parts, and is immune to frame to frame scene deformation. Accordingly, such an approach has clear benefits to conventional approaches for reducing FPN.

Figure 7A:
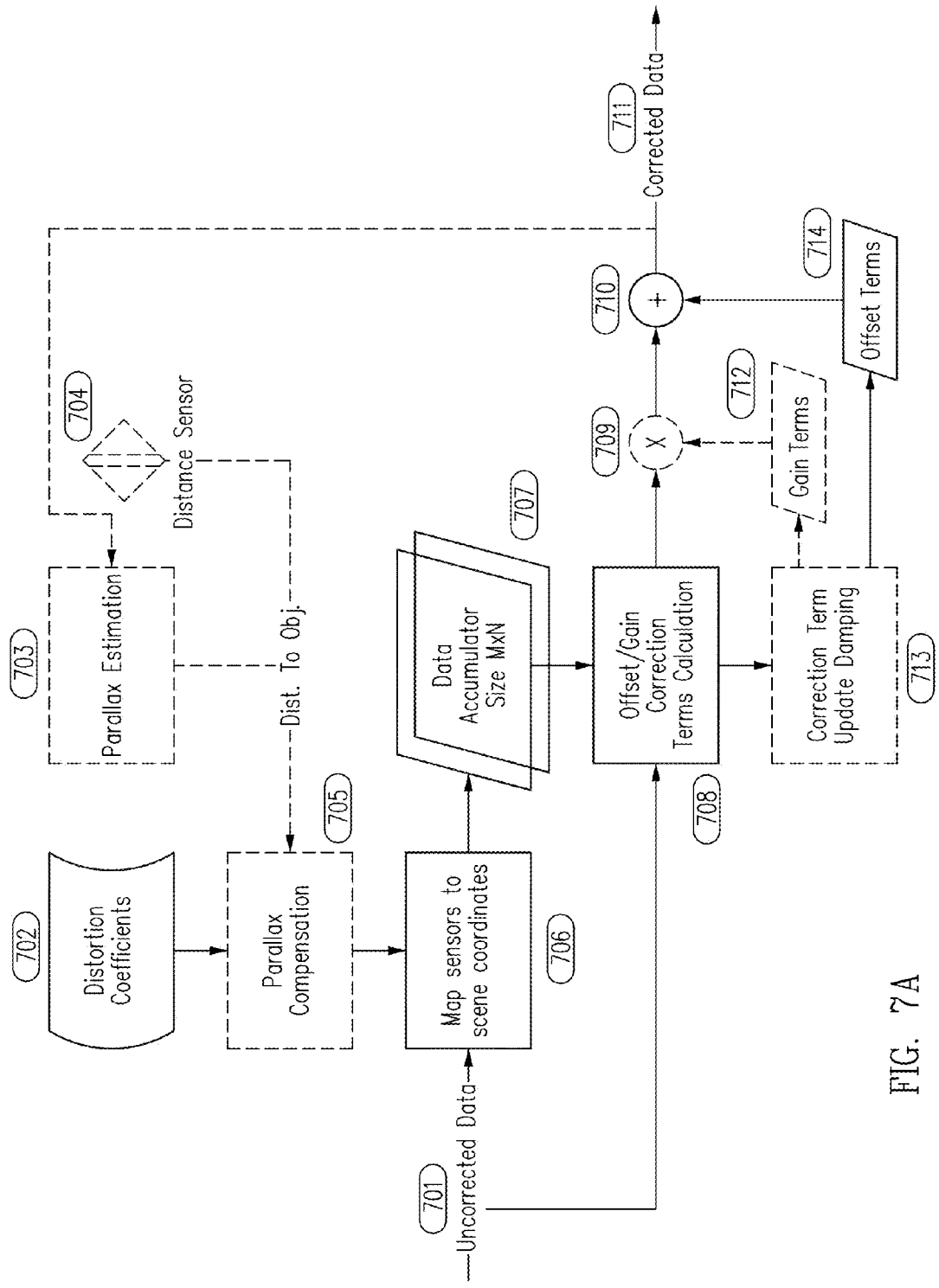
FIGS. 7A-B illustrate processes of calibrating sensors of an imager array in accordance with embodiments of the disclosure.

FIG. 7A illustrates a process of calibrating sensors 206 of imager array 200 in accordance with an embodiment of the disclosure. Advantageously, the process of FIG. 7A may be performed without a moving shutter and without obscuring scene 170 from view by imager array 200. In one embodiment, depending on the repeatability and accuracy of the design, manufacture, and assembly of sensor arrays 202, it may be possible to determine which sensor 206 in one sensor array 202 corresponds to other sensors 206 in other sensor arrays 202 (e.g., corresponding to the same coordinate or pixel of scene 170). However, if some production variation exists, then each sensor array 202 may be tested to determine such correspondence.

In this regard, sensor arrays 202 may be used to image a target (e.g., scene 170) having a known pattern and placed sufficiently far enough away to render any parallax negligible. For example, a collimator may be used to produce a target at infinity.

Individual sensor array 202 distortion coefficients 702 may identify offsets between individual sensors 206 and a global scene coordinate space. In one embodiment, the global scene coordinate space may be divided into discrete scene coordinates (e.g., scene pixels) at a resolution identical to that of individual sensor arrays 202. In one embodiment, the global scene coordinate space may correspond to a master sensor array 202.

Thus, distortion coefficients may be expressed relative to an ideal scene mapping provided by the global scene coordinate space. For example, the distortion coefficients may be expressed as vertical and horizontal offset values relative to the global scene coordinate space. Distortion coefficients 702 may be stored, for example, in a non volatile memory provided on imager array 200 or imaging system 100.

If imager array 200 is intended to be used at sufficiently small object distances such that parallax effects may render distortion coefficients 702 invalid, then uncorrected data 701 or distortion coefficients 702 may be optionally offset by appropriate parallax compensation values in accordance with a parallax compensation process in block 705. In this regard, because the distance between the optical centers of each sensor array 202 may be known, parallax effects may be readily determined in accordance with conventional techniques. Because parallax effects are stronger for closer objects, the parallax compensation process in block 705 may receive measurements or estimates of the distance between imager array 200 and scene 170 from a parallax estimation process in block 703, or from a distance sensor 704 (e.g., a laser range finder).

Alternatively, the parallax estimation process in block 703 may analyze images captured by each sensor array 202 and match common features. For example, conventional corner detection feature extraction processes may be used. As another example, block matching may be used to measure the amount of parallax. If the focal lengths of lenses 208 are known, and the distance between their optical centers is known, then the distance from each sensor array 202 to scene 170 becomes proportional to the parallax.

If multiple features (e.g., corners) are matched, multiple local parallax estimates may be calculated. These estimates may be averaged to provide a more accurate average scene distance, or they may be locally interpolated to provide a local distance map with spatially varying parallax. Observed object shifts due to parallax may be used to modify the distortion coefficients in the parallax compensation process of block 705.

In one embodiment, the parallax compensation process of block 705 may be performed (e.g., using appropriate processing or optics) by mapping images from sensor arrays 202 to locations on a super resolved grid. For example, the amount of parallax associated with a given sensor array 202 may be estimated by measuring the positions of visible non-occluded objects in scene 170 in all sensor arrays 202, or by using an appropriate external distance measuring device.

In block 706, uncorrected data 701 (e.g., signals, samples, or data values, such as pixel values) captured by each sensor 206 of sensor arrays 202 may be mapped, for example using a forward transform, to the global scene coordinate space by applying distortion coefficients 702 (e.g., optionally further offset for parallax compensation). In one embodiment, each sensor 206 (e.g., and its corresponding pixel) of each sensor array 202 may be mapped to a corresponding coordinate of the scene coordinate space, for example, by selecting a scene coordinate having a center that closest matches the center of the corresponding sensor 206. Appropriate interpolation techniques (e.g., using nearest neighbor approximations or other techniques) may also be used to map each sensor 206 to a corresponding scene coordinate (e.g., if a precise integer match is not available).

For each scene coordinate, sampled values (e.g., detected data) may be accumulated from one corresponding sensor 206 of each sensor array 202 to provide an accumulated value for each scene coordinate (block 707). For example, in one embodiment, 48 sensor arrays 202 may be provided. Accordingly, 48 sampled values (e.g., each value being provided by a corresponding sensor 206 in each of sensor arrays 202) may be accumulated for each scene coordinate.

In one embodiment, some sensors 206 of some sensor arrays 202 may not be mapped to scene coordinates because local distortion may be such that a particular sensor 206 images a location that is not part of a common FoV for the collective set of sensor arrays 202.

In one embodiment, a reference (e.g., "correct") scene irradiance (e.g., data value) may be determined for each scene coordinate and may be the mean of the sampled values (e.g., sampled irradiance levels) detected by the corresponding sensors 206 of sensor arrays 202. For example, the mean may be calculated for a scene coordinate by dividing the accumulated value for the scene coordinate by the number of sensors 206 mapped to the scene coordinate. To prevent overwriting the accumulated values when sampled values for the next image frame is available, two accumulators may be used in block 707, with one accumulator being written while the other accumulator is used to calculate offset correction terms (e.g., values) in block 708 as will be described.

In block 708, offset correction terms (e.g., values) may be calculated for all sensors 206. For example, if there are M×N sensor arrays 202, and each sensor array 202 has R×C sensors 206, then there may be a total of M×N×R×C offset correction terms.

In one embodiment, the offset correction term for a particular sensor 206 may be calculated by taking the difference between: the mean of the sampled values for the scene coordinate corresponding to the particular sensor 206; and the actual sampled value detected by the particular sensor 206. The offset correction terms may be stored in an offset correction term map (block 714).

Also in block 708, a set of gain correction terms may be determined. For example, one set (e.g., an image frame) of uncorrected data values captured at a time T0 may be stored and compared to another set captured at a time T1.

For any sensor 206, if the difference in the data values captured at times T0 and T1 is significantly larger than the expected noise, then it may be determined that the irradiance has increased or decreased. This difference may be independent of any offset error.

By comparing these differences for all sensors 206 measuring irradiance from the same location in scene 170 (e.g., all sensors corresponding to the same scene coordinate), a gain term may be determined for each sensor 206 to cause the relative responsivity of sensors 206 to be normalized (e.g., made equal) to each other (e.g., assuming that the FPN has not changed significantly between times T0 and T1). The gain terms may be stored in block 712.

For example, a mean V0 of sampled sensor values for a scene coordinate at time T0 may be calculated and stored in a memory. At later time T1, a mean V1 may be calculated and stored for the same scene coordinate exhibiting a change in irradiance. The scene coordinate may be mapped to a corresponding sensor 206 of each sensor array 202 (e.g., using inverse distortion coefficients further described herein). If a precise mapping is not available, a nearest neighbor sensor 206 may be chosen, or appropriate interpolation techniques may be used.

A difference D between the mean values (D=V1−V0) may represent the mean response to the change in irradiance in scene 170. If v0 and v1 represent the irradiance measured by a particular sensor 206 in a particular sensor array 202, then a difference d may represent the response of the particular sensor 206 (d=v0−v1) to the change in irradiance in scene 170. Accordingly, the gain correction term for the particular sensor may be D/d. For example, if D=10 and d=20, then the individual sensor 206 may be twice as responsive as the mean of all corresponding sensors 206, and the gain of the individual sensor 206 may therefore be adjusted by a gain term of 0.5 to normalize its response.

In one embodiment, the process of FIG. 7A may be performed iteratively such that offset correction terms 714 may be repeatedly updated. In this regard, an optional damping process (block 713) may be used to damp the rate of change of the offset correction terms by calculating a damped offset term using a weighted average of a previously stored offset correction term and a newly calculated offset correction term. In this regard, offset correction terms and gain correction terms may be damped using the process of block 713, thus reducing the effects of dramatic sample value differences in scene 170 with very strong gradients due to, for example, imperfectly modeled distortion effects on a coarse-grained sensor array 202.

As shown in FIG. 7A, gain terms 712 may be applied to uncorrected data 701 in block 709. Offset correction terms 714 may be applied to the gain-adjusted uncorrected data 701 (block 710) to provide corrected data 711. Corrected data 711 may also be used by the parallax estimation process in block 703.

Figure 7B:
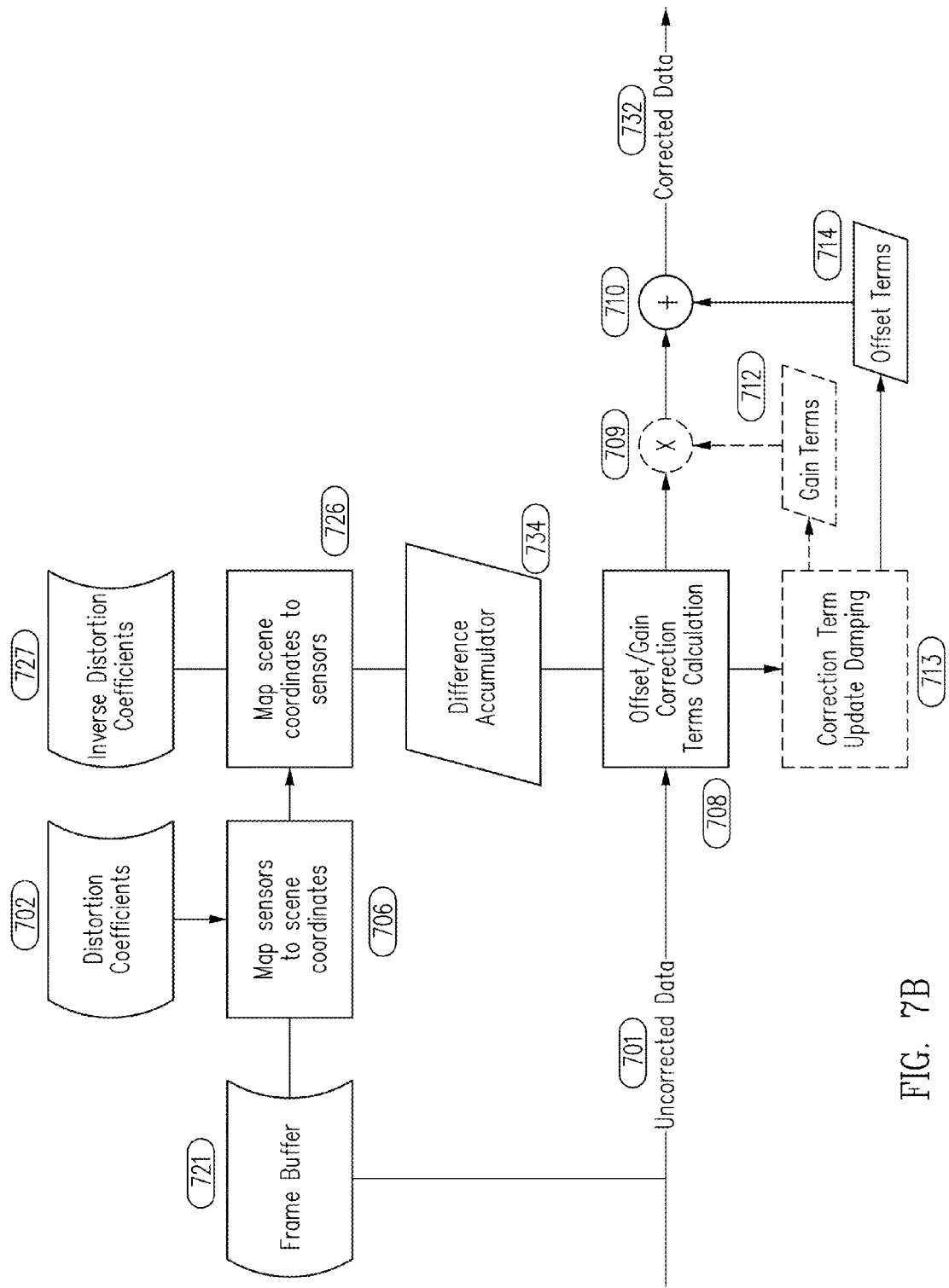

In one embodiment, the process of FIG. 7A may be a nearest neighbor approximation of a more general process identified in FIG. 7B. In this regard, FIG. 7B illustrates another process of calibrating sensors 206 of imager array 200 in accordance with an embodiment of the disclosure. Similar to FIG. 7A, the process of FIG. 7B may also be performed without a moving shutter and without obscuring scene 170 from view of imager array 200.

In the process of FIG. 7B, data values detected by sensors 206 of each sensor array 202 may be compared to one or more data values detected by sensors 206 of other sensor arrays 202 corresponding to the same location in scene 170. Differences between the data values may be accumulated to provide offset correction terms. In one embodiment, the data values of the sensors 206 of other sensor arrays 202 may be determined by performing an interpolation between some number of closest neighbor sensors 206.

Uncorrected data 701 may be provided to a frame buffer (block 721) and passed to block 706 where uncorrected data 701 may be mapped using distortion coefficients 702 in the manner previously described with regard to FIG. 7A. As such, each sensor 206 of each sensor array 202 may be mapped to a corresponding scene coordinate using distortion coefficients 702.

In addition, each scene coordinate may be mapped (e.g., also referred to as a reverse transform) to a corresponding sensor 206 in each of the sensor arrays 202 using inverse distortion coefficients 727 (e.g., also referred to as reverse distortion coefficients). For example, in one embodiment, each scene coordinate may be mapped to 48 different individual sensors 206 in 48 respective sensor arrays 202. Therefore, in this embodiment, 48 sets of inverse distortion coefficients 727 may be provided for each scene coordinate (e.g., with each set including a horizontal coefficient and a vertical coefficient) to map each scene coordinate to corresponding sensors 206 (block 726).

Appropriate interpolation techniques (e.g., using a linear combination of multiple nearest neighbors or other techniques) may also be used to map a scene coordinate to a corresponding sensor 206 in each sensor array 202 (e.g., if a precise integer match is not available) and to determine the sample value associated with the corresponding sensor 206. For example, each sensor 206 of a given sensor array 202 may be mapped to locations (e.g., corresponding sensors 206) of other sensor arrays 202 by, for example, bilinear interpolation of the four nearest inverse distortion coefficients 727.

Because the distortion (e.g., offsets) between sensors 206 relative to other sensors 206 of other sensor arrays 202 is constant, the mapping from a first sensor 206 in a first sensor array 202 to other corresponding sensors 206 in other sensor arrays 202 (e.g., using distortion coefficients 702 to map the first sensor 206 to a scene coordinate, and using inverse distortion coefficients 727 to map the scene coordinate the corresponding sensors 206 of other sensor arrays 202) may be pre calculated and stored, for example, in a table for each sensor 206. Thus, using the mapping determined in block 726, each sensor 206 of each sensor array 202 may be mapped to corresponding sensors 206 of the other sensor arrays 202.

In block 734, the sampled value of each sensor 206 may be compared with the sampled values of all other mapped corresponding sensors 206. Differences between the sampled value of each sensor 206 and the sampled values of its corresponding mapped sensors 206 may be accumulated (block 734). The accumulated differences may be used to calculate offset correction terms in block 708 in the manner described in FIG. 7A.

As shown in FIG. 7B, additional processing may be performed in blocks 708, 709, 710, 712, 713, and 714 as described in FIG. 7A to provide corrected data 732. In various embodiments, the processing of FIGS. 7A and 7B may be performed automatically.

In another embodiment, imager array 200 may be used to perform gas detection. Many gases are transparent in visible light. Some of these transparent gases may be directly harmful to humans or may have short or long term negative impacts on the environment. It is therefore important to detect emissions of such gases.

However, conventional multispectral systems used for gas detection are often complex and expensive. They often require multiple detectors arranged in complex systems with mirrors and filters that may be large in size, heavy, and sensitive to shock and vibration. Moreover, human-portable multispectral systems are also usually limited in the number of simultaneously detectable wavebands.

Various conventional gas emission detection techniques exist. For example, in one approach, the pressure of a system containing gas can be measured, and gas leakage may be detected by a decrease in pressure. However, such an approach may only work well if the pressure is kept constant and the gas leakage is significant, as it may be difficult to determine whether pressure changes are due to gas leaks, normal operation, or environmental changes such as temperature increases. Moreover, if the system containing the gas is large (e.g., a long pipe), it may also be difficult to locate the exact position of the leak.

For some gases, sensors may be used to detect the presence of the gas, such as conventional "sniffers" used to detect propane or natural gas leaks. However, such sensors are generally unsuitable for remote monitoring, as they typically must be in direct contact with the detected gas.

Figure 8A:
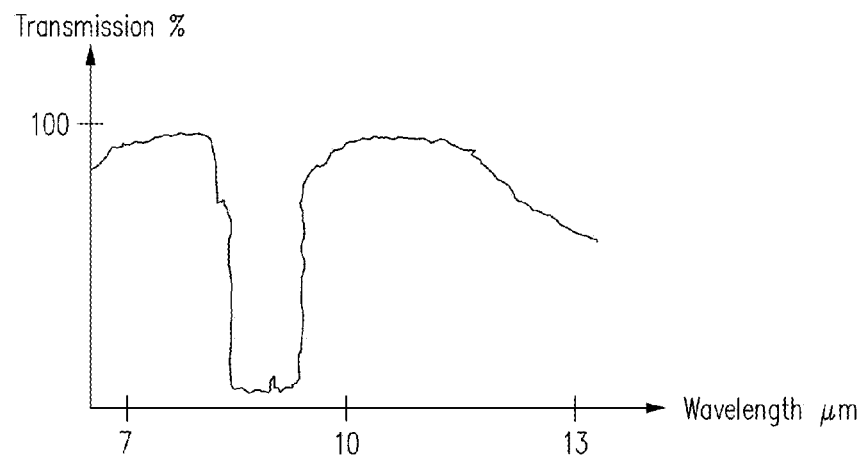
FIG. 8A illustrates transmission as a function of wavelength for a gas that may be detected by an imager array in accordance with an embodiment of the disclosure.
Figure 8B:
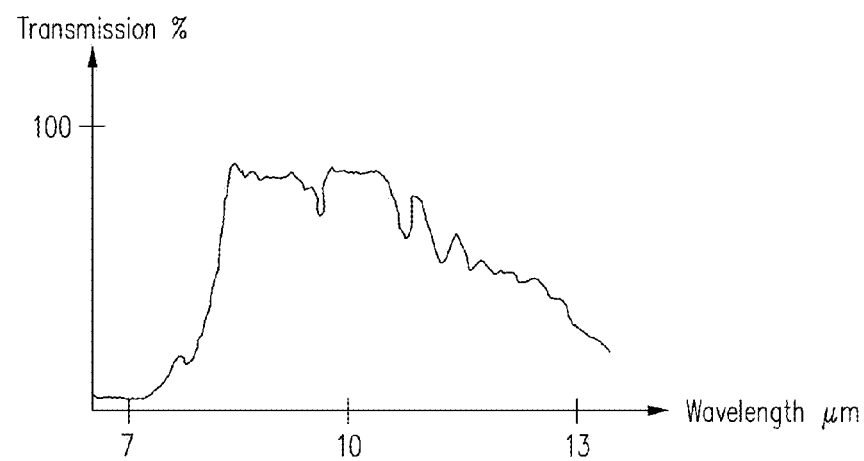
FIG. 8B illustrates transmission through the atmosphere as a function of wavelength for an atmospheric condition that may be detected by an imager array in accordance with an embodiment of the disclosure.

In another approach, a gas may be remotely sensed using a sensor that detects irradiation in or more of the absorption bands (e.g., spectral bands) of the gas. For example, FIG. 8A illustrates transmission as a function of wavelength for a gas, and FIG. 8B illustrates transmission through the atmosphere as a function of wavelength for an atmospheric condition.

For gases with absorption bands in the LWIR wavebands, a bandpass filter may be used. For example, the filter may be tuned such that it closely matches the absorption band of the gas. The bandpass filter may reduce the amount of irradiance that may be measured by the sensor to a few percent of what would be measured if the bandpass filter was not present. If the gas is present, it may absorb a significant amount of the total irradiance and an operator viewing an image provided by the sensor may be able detect the gas when it occludes the background of the image (e.g., causing a loss of signal of the background).

However, for such an approach to be effective, the one or more narrow wavebands absorbed by the gas must make up a significant amount of the total irradiance being measured by the sensor. For example, for an infrared sensor sensitive to electromagnetic radiation wavelengths in the range of 7-13 µm, the absorption band of the detected gas may represent only a fraction of a percent of the total irradiance detected by the sensor under typical imaging conditions. As a result, the gas may appear transparent to the sensor because most of the available signal from other objects in the background behind the gas may not be absorbed by the gas.

To improve the sensitivity of such sensors, a narrow bandpass filter may be provided that includes the gas absorption band. In this case, the gas may absorb a large percentage of electromagnetic radiation in the narrow band which makes the gas easier to detect (e.g., there may be a greater relative difference between an image captured when gas is present and an image captured when gas is not present). However, such an approach may require the sensor to be highly responsive. For example, if 95 percent of the signal is lost due to the bandpass filter, then the sensor may need to be 20 times more sensitive to preserve scene fidelity. Such highly sensitive sensors may require very high performance imaging systems (e.g., in the infrared waveband, such systems may use cryogenically cooled sensors with large aperture optics). As a result, such systems may be two orders of magnitude more expensive than uncooled infrared systems, may have significant power requirements which make them unsuitable for battery operation, and may be larger and heavier than uncooled systems.

Moreover, some materials (e.g., other than gas) may have spectral properties that match that of the gas being detected such that the irradiance from such materials mostly fall within the absorption band of the gas. This may cause false alarms. For example, some surfaces such as painted surfaces or metals may emit very little signal in a band matching that of one of the gas absorption bands. One way to reduce such false alarms is to measure irradiance in multiple spectral bands that match multiple absorption bands of the gas. This can be accomplished by designing a spectral filter that has significant transmission in more than one spectral band. However, this may complicate the design of the filter and may limit its efficiency (e.g., as measured by the percent of irradiance transmitted to the sensor). Another way to reduce such false alarms is to time multiplex multiple filters having different spectral bands (e.g., by using a rotating filter wheel and a single detector).

However, such an approach may require registering images to compensate for imager or scene motion (e.g., misalignment may be introduced when imaging non static scenes or when the imager is hand held or otherwise moving). In addition, such an approach may only allow for short integration or exposure times that are set by the period of the filter wheel rotations.

Figure 8C:
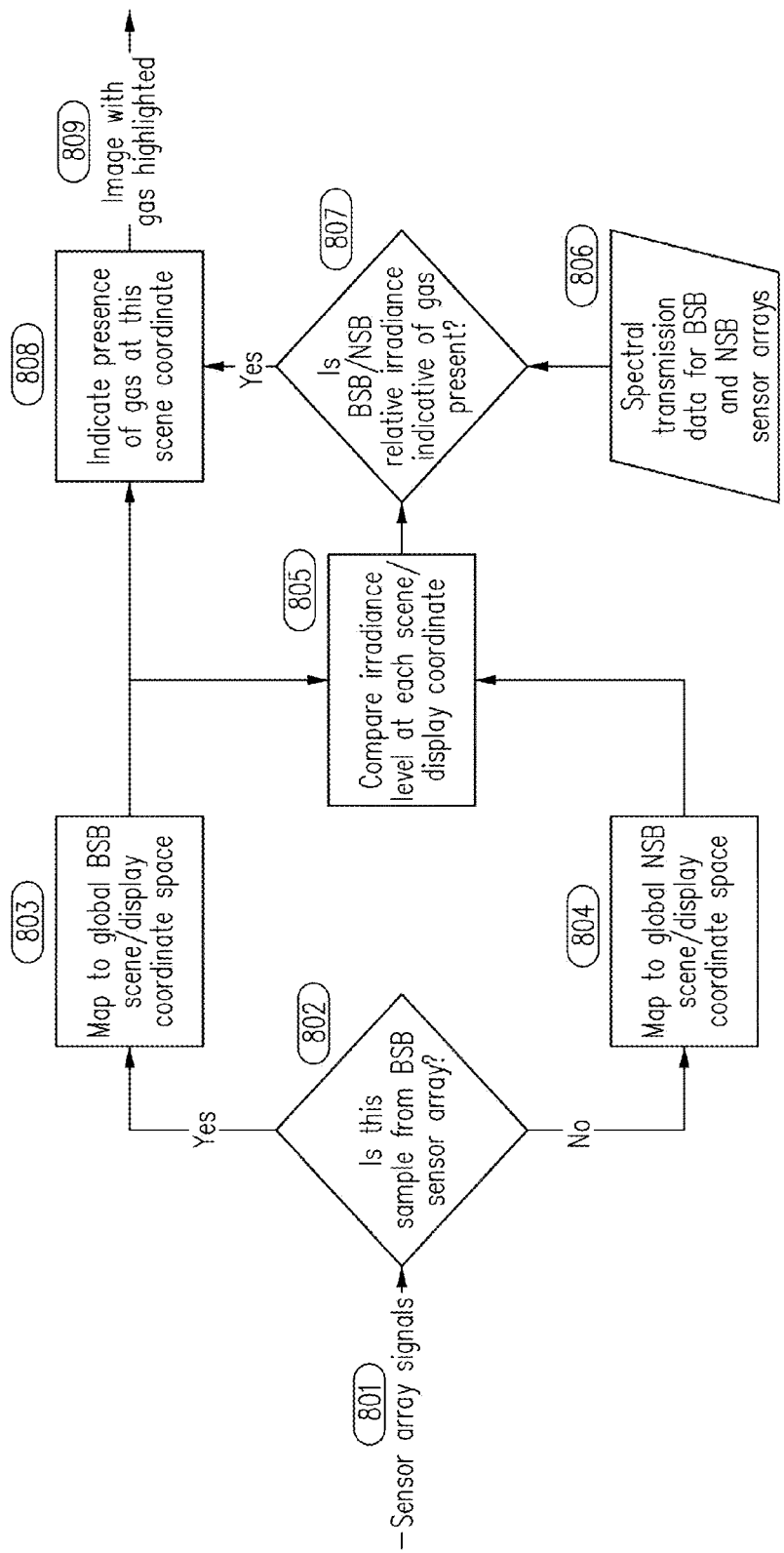
FIG. 8C illustrates a process of performing gas detection in accordance with an embodiment of the disclosure.

FIG. 8C illustrates a process of performing gas detection in accordance with an embodiment of the disclosure. As discussed, different sensor arrays 202 may detect different broad or narrow bands (e.g., wavelength ranges) of electromagnetic radiation. Accordingly, sensor array signals 801 (e.g., signals, samples, or data values, such as pixel values, provided by various sensor arrays 202 in response to detected electromagnetic radiation) may be provided that correspond to different bands. In one embodiment, some sensor arrays 202 may be configured to detect broad spectral bands (BSB) of electromagnetic radiation, and other sensor arrays 202 may be configured to detect narrow spectral bands (NSB) of electromagnetic radiation. For example, the NSB may approximately match one of the absorption bands (e.g., wavelength ranges) of a known gas (e.g., as shown in FIG. 8A). In one embodiment, NSBs may include all or portions of various wavebands, such as thermal radiation, LWIR radiation, MWIR radiation, SWIR radiation, NIR radiation, visible light (VIS), and/or other ranges. In one embodiment, BSBs may include wavebands greater than that of such NSBs.

Lenses 208 associated with the BSB or NSB sensor arrays 202 may be coated or otherwise filtered to reflect most electromagnetic radiation outside of their respective bands. Therefore, sensor array signals 801 may include some signals corresponding to BSB electromagnetic radiation and some signals corresponding to NSB electromagnetic radiation.

In block 802, sensor array signals 801 are processed to determine whether they correspond to a BSB sensor array or an NSB sensor array. In this regard, samples corresponding to BSB sensor array signals are passed to block 803 where the samples are mapped to a global BSB scene coordinate space In this regard, each sensor 206 and its corresponding pixel of each BSB sensor array 202 may be mapped to a corresponding coordinate of the BSB scene coordinate space, for example, by selecting a scene coordinate (e.g., pixel) having a center that closest matches the center of the corresponding sensor 206. Samples corresponding to NSB sensor array signals are passed to block 804 where the samples are mapped to a global NSB scene coordinate space. In this regard, each sensor 206 and its corresponding pixel of each NSB sensor array 202 may be mapped to a corresponding coordinate of the NSB scene coordinate space, for example, by selecting a scene coordinate having a center that closest matches the center of the corresponding sensor 206.

At block 805, the mapped samples (e.g., pixel values) provided by the BSB sensor arrays 202 for particular scene coordinates are compared with the mapped samples (e.g., pixel values) provided by the NSB sensor arrays 202 for the same scene coordinates. For example, in one embodiment, the NSB may be a subset of the BSB. In this case, if approximately 5 percent of the irradiance measured by the BSB sensor arrays 202 is attributable to NSB electromagnetic radiation, then it may be expected that the signal provided by an NSB sensor array 202 for a particular scene coordinate may correspond to approximately 5 percent of the signal provided by a BSB sensor array 202 for the same scene coordinate.

Therefore, if mapped sample value provided by the NSB sensor array 202 is close to zero or at least much lower than 5 percent of the mapped sample value provided by the BSB sensor array 202 for the same scene coordinate, then such values may indicate that a gas is present at the scene coordinate (block 807) (e.g., a gas is absorbing NSB electromagnetic radiation at the scene coordinate). The presence of the gas may be indicated at the scene coordinate by processing the mapped samples (block 808) using spectral transmission data for BSB and NSB sensor arrays (block 806) to provide an image 809 (e.g., a result image) that is, for example, highlighted or color coded at the scene coordinates corresponding to the identified gas.

In another embodiment, different NSB sensor arrays 202 may detect NSB electromagnetic radiation in different narrow bands. For example, a first group of one or more NSB sensor arrays 202 may detect NSB electromagnetic radiation in a first narrow band, and a second group of one or more NSB sensor arrays 202 may detect NSB electromagnetic radiation in a second narrow band that differs from the first narrow band. Additional groups of NSB sensor arrays 202 associated with other narrow bands may also be provided.

Gases may be detected with high accuracy using different NSB sensor arrays 202 directed toward different NSBs. For example, the different NSBs may be associated with different absorption bands of the same gas. Thus, by using such different NSB sensor arrays 202 in the process of FIG. 8C, sample values (e.g., signal strength) provided by BSB sensor arrays 202 may be compared with sample values provided by different NSB sensor arrays 202 for different NSBs. Thus, if a gas has multiple absorption bands, then the detection of such bands using the different NSBs may increase the accuracy of gas detection and reduce the likelihood of false detections (e.g., due to multiple gases or materials sharing an identical or similar absorption band).

In another embodiment, one or more NSB sensor arrays 202 may detect NSB electromagnetic radiation in multiple narrow bands that match the absorption bands of multiple gases. In this case, multiple gases with different spectral properties may be detected.

Moreover, any of the described approaches using NSB sensor arrays 202 may be combined as desired. For example, one or more multiple NSB sensor arrays 202 may be used to detect multiple NSBs for a single gas or different gases. Advantageously, the use of NSB sensor arrays 202 may permit multiple types of gases to be detected by a single imager array 200.

Figure 9A:
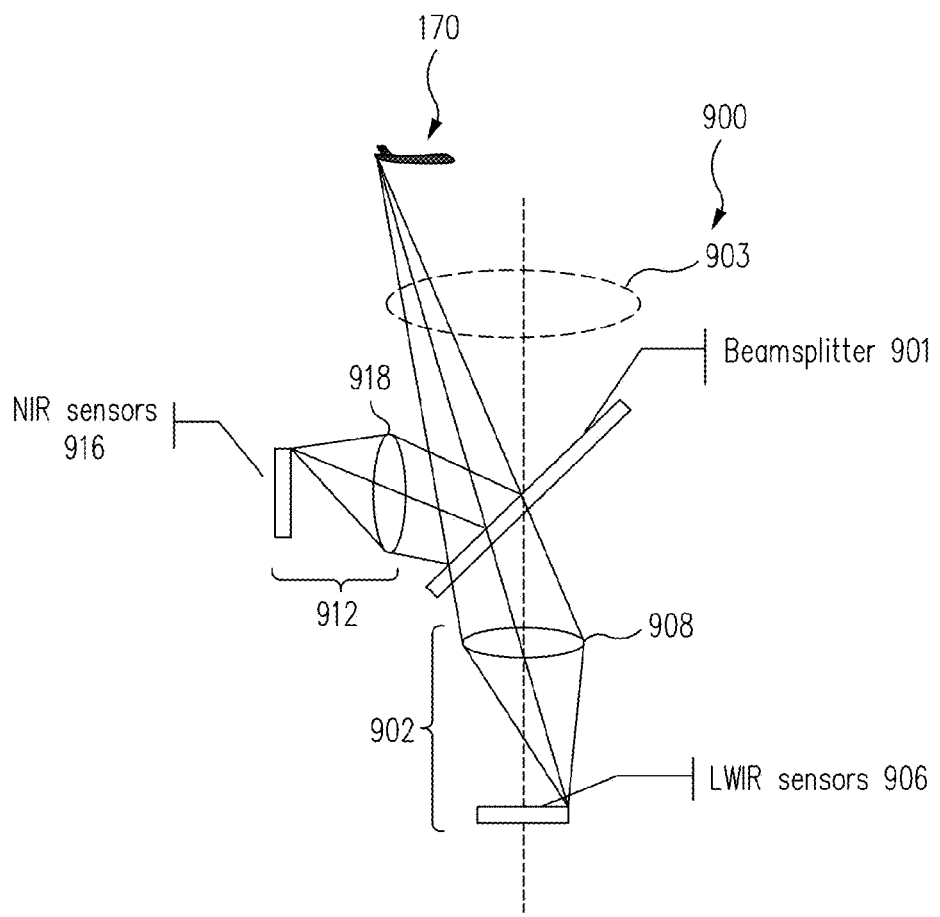
FIG. 9A illustrates an imager array including a plurality of sensor arrays and a beamsplitter in accordance with an embodiment of the disclosure.

In various embodiments, the features of imager array 200 may be applied to other implementations. For example, FIG. 9A illustrates an imager array 900 including a plurality of sensor arrays 902/912 and a beamsplitter 901 in accordance with an embodiment of the disclosure. For example, in one embodiment, sensor array 902 may include sensors 906 (e.g., InGaAs sensors) and a lens 908 provided by a LWIR camera, and sensor array 912 may include sensors 916 (e.g., InGaAs sensors) and a lens 918 be provided by a VIS/NIR camera. In this regard, two cameras may be used in the illustrated embodiment if, for example, no suitable detector material is available that is sensitive to all wavebands of interest. Advantageously, LWIR and VIS/NIR cameras may be implemented without requiring the extra weight and size of associated cooling equipment.

As shown in FIG. 9A, electromagnetic radiation from scene 170 may pass through a common shared aperture 903 to beamsplitter 901 which passes or reflects the electromagnetic radiation to sensor arrays 902 and 912. The use of beamsplitter 901 and shared aperture 903 may minimize parallax between the two cameras. Although only two sensor arrays 902/912 are identified in FIG. 9A, it will be appreciated that any desired number of sensor arrays 902/912 or cameras may be used.

Because phase shift between sensor arrays 902 and 916 may be used to provide various features (e.g., in accordance with embodiments described in this disclosure), sensor arrays 902 and 916 need not be precisely aligned with each other. This reduces the need for a complex boresighting process and mechanism in this embodiment.

Figure 9B:
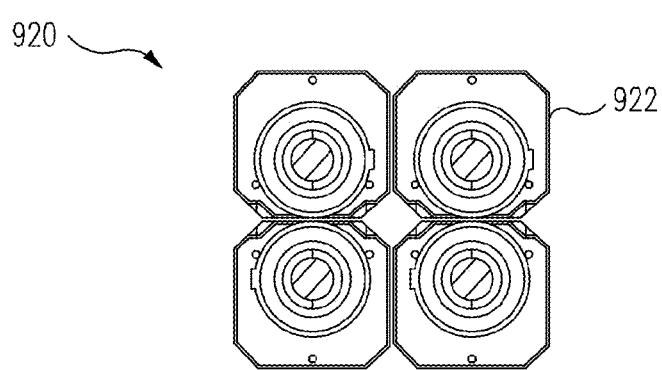
FIG. 9B illustrates an imager array including a plurality of cameras in accordance with an embodiment of the disclosure.

FIG. 9B illustrates an imager array 920 including a plurality of cameras 922 in accordance with an embodiment of the disclosure. In this embodiment, individual cameras 922 may be used in place of individual sensor arrays 202. Although only two cameras 922 are identified in FIG. 9B, it will be appreciated that any desired number of cameras 922 may be used.

Imagers sensitive to radiation in the infrared waveband usually have only a small number of sensors compared to imagers sensitive to radiation in the visible wave band. This is due to various reasons such as, for example, the larger aperture optics and larger sensor elements typically used for infrared radiation, as well as the cost of materials (e.g., germanium and silicon) used for infrared optics.

In one embodiment, an artificial neural network (ANN) may be used to estimate high resolution images from low resolution images provided by sensor arrays 202. Such high resolution images may be used, for example, for target tracking or other applications.

An ANN may be used to implement a nonlinear classification process in which nonlinear, scene-dependent, and wavelength-dependent relationships are mapped between low spatial frequency signals (e.g., low resolution pixel values captured of a scene) to corresponding high spatial frequency signals (e.g., high resolution pixel values stored in a database for scenes previously imaged at high resolution). For example, one or more such ANNs may be implemented to perform radial basis function (RBF) processing techniques which may be suitable for hardware (e.g., using digital circuitry, analog ROIC circuitry, or other circuitry) or software implementations.

In one embodiment, the ANN may include individual artificial neurons (e.g., modeled on a brain) that are implemented by individual processors in a completely parallel architecture. In this case, all such processors may be configured to access data simultaneously and provide output data within several clock cycles.

Figure 10:
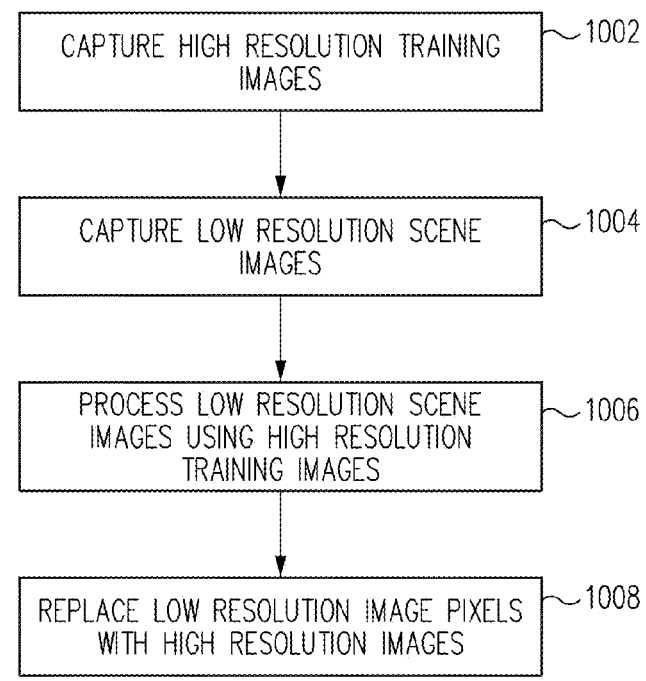
FIG. 10 illustrates a process of providing a high resolution image using an artificial neural network in accordance with an embodiment of the disclosure.

FIG. 10 illustrates a process of providing a high resolution image using an ANN in accordance with an embodiment of the disclosure. For example, in one embodiment, the ANN may be provided by appropriate processors, memories, and machine readable instructions of imaging system 100.

In block 1002, imaging system 100 captures high resolution training images of a desired type of scene 170. For example, imaging system 1002 may use a separate high resolution imager array, or may configure imager array 200 for high resolution operation (e.g., by using all of sensor arrays 202 as a single sensor array). In one embodiment, the training performed in block 1002 may be performed non-iteratively may greatly improve the real time possibilities for online performance enhancements (e.g., continuous scene learning).

The high resolution training images may be stored, for example, in an appropriate memory of imaging system 100, a local or remote database, or any other desired location. Thus, imaging system 100 may have access to a set of high resolution training images (e.g., a learned "dictionary") of a particular type of scene 170 which may be subsequently imaged by low resolution sensor arrays 202 of imager array 200.

In block 1004, imaging system 100 captures one or more low resolution images of a particular scene 170 using low resolution sensor arrays 202. In block 1006, imaging system 100 processes individual pixels (e.g., using an ANN in accordance with RBF techniques) of the low resolution image to determine a mapping from each pixel to at least a portion of one or more of the high resolution training images.

In one embodiment, the scene imaged in block 1004 should be at least similar to the scene imaged in block 1002 in order to increase the likelihood of accurate pixel mappings in block 1006. For example, if the scenes are significantly different, then imaging system 100 may flag the low resolution scene images as invalid.

In block 1008, imaging system 100 replaces the pixels of the low resolution image with the mapped high resolution training images to provide a resulting high resolution image (e.g., a result image).

In one embodiment, the process of FIG. 10 may permit low resolution images to be converted into high resolution images on par or better than would be available with a conventional single aperture imager. For example, in one embodiment, the process of FIG. 10 may convert low resolution images of approximately 80 by 80 pixels up to high resolution images.

Moreover, because the process of FIG. 10 does not require the calculation of a per pixel optical flow, the computational burden may be kept reasonable and well within the processing available in a custom system on a chip (SoC) device.

In another embodiment, the process of FIG. 10 may be modified in accordance with various alternate process steps. For example, in block 1002, low resolution training images (e.g., low resolution versions of the high resolution training images) may also be provided. In one embodiment, the high resolution training images may be captured by a high resolution sensor array (e.g., sensor array 232) and the low resolution training images may be captured by a low resolution sensor array (e.g., sensor array 202).

Such high and low resolution training images may be captured substantially simultaneously using different sensor arrays 232 and 202, where a high resolution training image may have a narrow FoV contained within the imaging cone of a wide FoV of a low resolution training image. For example, if the image cone identified by twice the angle ρ is within the image cone identified by twice the angle φ (see FIG. 2D), and the images provided by sensor arrays 202 and 232 are accurately mapped to a common scene coordinate space, the low resolution training image may be provided directly from the image captured by sensor array 202 (e.g., if the low resolution is half the high resolution, then 8 by 8 pixels from imager array 232 may be represented as 4 by 4 pixels from imager array 202).

In another embodiment, the high and low resolution training images may be captured using identical sensor arrays with different optics to provide different narrow and wide FoVs. In another embodiment, the high and low resolution training images may be captured at different times using a single optic capable of using at least two different magnification settings (e.g., different zoom positions). In another embodiment, a low resolution training image may be created by blurring a high resolution training image and resampling at a lower resolution density.

The high and low resolution training images provided in block 1002 may be separated into a plurality of sub images before being stored in a database. For example, in one embodiment, each low resolution training sub image may provide 8 by 8 pixels. Also in block 1002, the low resolution training sub images may be mapped to their corresponding high resolution sub images.

In block 1006, low resolution images (e.g., non-training images captured in block 1004) may be separated into a plurality of sub images, and the sub images may be mapped to previously stored low resolution training sub images. For example, in one embodiment, such mapping may be based on a Euclidian distance calculated between a vector defined by pixel values of the non-training low resolution sub images and a vector defined by pixel values of the training low resolution sub images.

Also in block 1006, the low resolution training sub images that have been mapped to the non-training low resolution sub images may be used to identify high resolution sub images (e.g., previously mapped to the low resolution training sub images in block 1002). As a result, the identified high resolution sub images may be used to replace the non-training low resolution sub images in block 1008 to provide a high resolution image (e.g., a result image).

In other embodiments, motion free, sample based, or single image super resolution processing techniques may be used with imager array 200. For example, such techniques may rely upon a learned database (e.g., dictionary) of high resolution images (e.g., samples), and the quality (e.g., measured by a peak signal to noise ratio (PSNR)) of a super resolved result image may depend significantly on the similarity between images in the database and the imaged scene 170. Therefore, the quality of result images obtained using such techniques may be improved if the high resolution images in the database are images of the actual imaged scene 170.

In accordance with various embodiments, imager array 200 may be used and/or modified for use in a variety of other applications. For example, in one embodiment, imaging system 100 may process images provided by various sensor arrays 202 to simultaneously provide the images to a user as well as perform signature correlation to perform, for example, laser targeting, automated target detection and tracking, or other operations.

In other embodiments, imager array 200 may be used in various applications such as, for example, night vision goggles, ballistic mounted detection and tracking, autonomous vehicle payloads, and others. In one embodiment, imager array 200 may be implemented with a relatively small size and a substantially flat profile that permits convenient integration into clothing, helmets, or other installations. For example, a cube implemented with six imager arrays 200 (e.g., one imager array 200 per plane of the cube) may be used to provide full spherical imaging.

In other embodiments, imager array 200 may be used in various consumer-oriented applications where low cost, multispectral, infrared, or other types of imaging systems may be useful. In another embodiment, imager array 200 may be used to perform automatic calibration in radiometric applications by taking into account emissivity in different wavebands.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

The foregoing disclosure is not intended to limit the present invention to the precise forms or particular fields of use disclosed. It is contemplated that various alternate embodiments and/or modifications to the present invention, whether explicitly described or implied herein, are possible in light of the disclosure.

Embodiments described above illustrate but do not limit the invention. It should also be understood that numerous modifications and variations are possible in accordance with the principles of the invention. Accordingly, the scope of the invention is defined only by the following claims.

What is claimed is:

1. An imaging system comprising:
a housing;
an imager array disposed in the housing and adapted to image a scene, wherein the imager array comprises:
 a plurality of sensor arrays, wherein each sensor array comprises:
  a lens adapted to receive electromagnetic radiation from the seen, and
  a plurality of sensors adapted to capture an image of the scene based on the electromagnetic radiation received through the lens,
 the imager is adapted to capture a first image of the scene using at least a first one of the sensor arrays, and
 the imager array is adapted to capture a second image of the scene using at least a second one of the sensor arrays substantially simultaneously with the first image, wherein the second image has a higher resolution than the first image; a database comprising a mapping from the first image to the second image; and
 a processor adapted to:
  map a third image provided by the imager array to the first image,
  wherein the third image has a resolution substantially equal to the first image, and
  replace the third image with the second image to provide a high resolution result image.

2. The imaging system of claim 1, wherein each sensor array further comprises a filter adapted to pass only a subset of the electromagnetic radiation to the sensors.

3. The imaging system of claim 2, wherein the filter is a coating on the lens of the sensor array.

4. The imaging system of claim 1, wherein a third one of the sensor arrays comprises a first filter adapted to limit the electromagnetic radiation received by the lens of the third sensor array to a first spectral range, and a fourth one of the sensor arrays comprises a second filter adapted to limit the electromagnetic radiation received by the lens of the fourth sensor array to a second spectral range.

5. The imaging system of claim 1, wherein the sensor arrays are substantially equal in size.

6. The imaging system of claim 1, wherein at least a third one of the sensor arrays is greater in size than a fourth one of the sensor arrays, wherein the third sensor array is adapted to capture an image of the scene with higher resolution and a narrower field of view than the fourth sensor array.

7. The imaging system of claim 1, wherein the imager array further comprises a plurality of partitions adapted to block electromagnetic radiation outside a desired field of view of the sensors.

8. The imaging system of claim 1, wherein the imager array is a vacuum package and the lenses provide windows for the vacuum package.

9. The imaging system of claim 1, wherein at least two of the sensor arrays exhibit parallax relative to each other and are adapted to provide stereo images of the scene.

10. The imaging system of claim 1, wherein each sensor array comprises an optical axis extending from the lens to the sensors, wherein the optical axes of at least two of the sensor arrays exhibit phase shifts relative to each other, wherein images provided by the at least two sensor arrays are phase shifted relative to each other.

11. The imaging system of claim 10, further comprising a processor adapted to perform super resolution processing of the phase shifted images to provide a result image of the scene with a resolution greater than the resolution of the at least two sensor arrays.

12. The imaging system of claim 1, wherein one of the sensors in a third one of the sensor arrays is defective, wherein the imaging system further comprises a processor adapted to replace image data associated with the defective sensor with image data associated with a corresponding one of the sensors in a fourth one of the sensor arrays.

13. The imaging system of claim 1, further comprising a processor adapted to combine the images to provide a result image of the scene with a signal to noise ratio lower than signal to noise ratios of the images captured by the sensors.

14. The imaging system of claim 13, wherein the processor is adapted to:
map the sensors to a grid comprising a plurality of pixels;
accumulate signals from at least two of the sensor arrays for each of the grid pixels; and
provide the result image from the grid pixels.

15. The imaging system of claim 1, wherein the imaging system is a thermal camera.

16. A method of imaging, the method comprising:
receiving electromagnetic radiation from a scene at an imager array disposed in a housing of an imaging system, wherein the imager array comprises a plurality of sensor arrays, wherein each sensor array comprises a lens adapted to receive the electromagnetic radiation from the scene and a plurality of sensors adapted to capture an image of the scene based on the electromagnetic radiation received through the lens;
capturing a plurality of images of the scene substantially simultaneously using the sensors of the sensor arrays, wherein the capturing comprises:
capturing a first image of the scene using at least a first one of the sensor arrays, and
capturing a second image of the scene using at least a second one of the sensor arrays substantially simultaneously with the first image, wherein the second image has a higher resolution than the first image;
mapping the first image to the second image;
mapping a third image provided by the imager array to the first image, wherein the third image has a resolution substantially equal to the first image; and
replacing the third image with the second image to provide a high resolution result image.

17. The method of claim 16, wherein each sensor array further comprises a filter adapted to pass only a subset of the electromagnetic radiation to the sensors.

18. The method of claim 17, wherein the filter is a coating on the lens of the sensor array.

19. The method of claim 16, further comprising:
filtering the electromagnetic radiation received by the lens of a third one of the sensor arrays to a first spectral range; and
filtering the electromagnetic radiation received by the lens of a fourth one of the sensor arrays to a second spectral range.

20. The method of claim 16, wherein the sensor arrays are substantially equal in size.

21. The method of claim 16, wherein at least a third one of the sensor arrays is greater in size than a fourth one of the sensor arrays, wherein the image captured by the third sensor array has a higher resolution and a narrower field of view than the image captured by the fourth sensor array.

22. The method of claim 16, further comprising blocking electromagnetic radiation outside a desired field of view of the sensors using a plurality of partitions.

23. The method of claim 16, wherein the imager array is a vacuum package and the lenses provide windows for the vacuum package.

24. The method of claim 16, wherein at least two of the sensor arrays exhibit parallax relative to each other and their captured images are stereo images of the scene.

25. The method of claim 16, wherein each sensor array comprises an optical axis extending from the lens to the sensors, wherein the optical axes of at least two of the sensor arrays exhibit phase shifts relative to each other, wherein images provided by the at least two sensor arrays are phase shifted relative to each other.

26. The method of claim 25, further comprising performing super resolution processing of the phase shifted images to provide a result image of the scene with a resolution greater than the resolution of the at least two sensor arrays.

27. The method of claim 16, wherein one of the sensors in a third one of the sensor arrays is defective, the method further comprising replacing image data associated with the defective sensor with image data associated with a corresponding one of the sensors in a fourth one of the sensor arrays.

28. The method of claim 16, further comprising combining the images to provide a result image of the scene with a signal to noise ratio lower than signal to noise ratios of the images captured by the sensors.

29. The method of claim 28, further comprising:
mapping the sensors to a grid comprising a plurality of pixels;
accumulating signals from at least two of the sensor arrays for each of the grid pixels; and
providing the result image from the grid pixels.

30. The method of claim 16, wherein the method is performed by a thermal camera.

31. A gas detection system comprising:
an imager array adapted to image a scene, wherein the imager array comprises a plurality of sensor arrays, and wherein each sensor array comprises:
a lens adapted to receive electromagnetic radiation from the scene, and
a plurality of sensors adapted to capture an image of the scene based on the electromagnetic radiation received through the lens;
wherein a first one of the sensor arrays is adapted to capture a first image of a first wavelength range of the electromagnetic radiation;

wherein a second one of the sensor arrays is adapted to capture a second image of a second wavelength range of the electromagnetic radiation; and wherein the second wavelength range is a subset of the first wavelength range and substantially corresponds to an absorption band of a gas.

32. The gas detection system of claim 31, further comprising a processor adapted to compare the first and second images to determine a presence of the gas in the scene.

33. The gas detection system of claim 32, wherein the processor is further adapted to:
map pixels of the first and second images to a coordinate space;
compare pixels of the first and second images mapped to the same coordinates in the coordinate space; and
determine the presence of the gas in the scene based on values of the pixels.

34. The gas detection system of claim 32, wherein the processor is further adapted to provide a result image that indicates the presence of the gas in the scene.

35. The gas detection system of claim 31, wherein the second sensor array comprises a filter adapted to pass only the second wavelength range of the electromagnetic radiation to the sensor.

36. The gas detection system of claim 35, wherein the filter is a coating on the lens of the second sensor array.

37. The gas detection system of claim 31, wherein a third one of the sensor arrays is adapted to capture a third wavelength range of the electromagnetic radiation, wherein the third wavelength range is a subset of the first wavelength range and substantially corresponds to another absorption band of the gas.

38. The gas detection system of claim 31, wherein a third one of the sensor arrays is adapted to capture a third wavelength range of the electromagnetic radiation, wherein the third wavelength range is a subset of the first wavelength range and substantially corresponds to an absorption band of another gas.

39. The gas detection system of claim 31, wherein the first and second sensor arrays are adapted to capture the first and second images substantially simultaneously.

40. The gas detection system of claim 31, wherein the gas detection system is a thermal camera further comprising a housing, wherein the imager array is disposed in the housing.

41. A method of detecting gas, the method comprising:
receiving electromagnetic radiation from a scene at an imager array, wherein the imager array comprises a plurality of sensor arrays, and wherein each sensor array comprises a lens adapted to receive the electromagnetic radiation from the scene and a plurality of sensors adapted to capture an image of the scene based on the electromagnetic radiation received through the lens;
capturing a first image of a first wavelength range of the electromagnetic radiation using a first one of the sensor arrays; and
capturing a second image of a second wavelength range of the electromagnetic radiation using a second one of the sensor arrays, wherein the second wavelength range is a subset of the first wavelength range and substantially corresponds to an absorption band of a gas.

42. The method of claim 41, further comprising comparing the first and second images to determine a presence of the gas in the scene.

43. The method of claim 42, wherein the comparing comprises:
mapping pixels of the first and second images to a coordinate space;
comparing pixels of the first and second images mapped to the same coordinates in the coordinate space; and
determining the presence of the gas in the scene based on values of the pixels.

44. The method of claim 42, further comprising providing a result image that indicates the presence of the gas in the scene.

45. The method of claim 41, wherein the second sensor array comprises a filter adapted to pass only the second wavelength range of the electromagnetic radiation to the sensor.

46. The method of claim 45, wherein the filter is a coating on the lens of the second sensor array.

47. The method of claim 41, further comprising capturing a third image of a third wavelength range of the electromagnetic radiation using a third one of the sensor arrays, wherein the third wavelength range is a subset of the first wavelength range and substantially corresponds to another absorption band of the gas.

48. The method of claim 41, further comprising capturing a third image of a third wavelength range of the electromagnetic radiation using a third one of the sensor arrays, wherein the third wavelength range is a subset of the first wavelength range and substantially corresponds to an absorption band of another gas.

49. The method of claim 41, wherein the capturing the first and second images are performed substantially simultaneously.

50. The method of claim 41, wherein the imager array is disposed in a housing of a thermal camera.

51. An imager calibration system comprising:
an imager array adapted to image a scene, wherein the imager array comprises a plurality of sensor arrays, and wherein each sensor array comprises:
a lens adapted to receive electromagnetic radiation from the scene, and
a plurality of sensors adapted to capture an image of the scene based on the electromagnetic radiation received through the lens; and
a processor adapted to:
receive a plurality of pixel values associated with the images captured by the sensors of the sensor arrays,
map the sensors to a coordinate space, wherein at least one sensor of each sensor array is mapped to each coordinate of the coordinate space, and
calculate an offset correction term for each sensor based on the pixel values of all sensors mapped to the same coordinate.

52. The imager calibration system of claim 51, wherein the imager calibration system is adapted to calibrate the imager array using the offset correction terms without obscuring the scene from view by the imager array.

53. The imager calibration system of claim 51, wherein the processor is adapted to:
accumulate the pixel values of all sensors mapped to each coordinate to provide an accumulated value for each coordinate; and
use the accumulated values to determine a mean value for each coordinate to calculate the offset correction terms.

54. The imager calibration system of claim 51, wherein the processor is adapted to;
determine differences between the pixel value of each sensor and the pixel values of all other sensors mapped to the same coordinate; and
accumulate the differences to calculate the offset correction terms.

55. The imager calibration system of claim 54, wherein the processor is adapted to map each coordinate to at least one sensor of each sensor array by horizontal and vertical offset values to determine the differences.

56. The imager calibration system of claim 51, wherein the processor is adapted to interpolate at least some of the pixel values to calculate at least one of the offset correction terms.

57. The imager calibration system of claim 51, wherein the processor is adapted to interpolate at least some of the coordinates to map at least one of the sensors to the coordinate space.

58. The imager calibration system of claim 51, wherein the processor is adapted to map the sensors to the coordinate space by horizontal and vertical offset values to account for variations among the sensor arrays.

59. The imager calibration system of claim 51, wherein the processor is adapted to adjust the map of the sensors to the coordinate space to compensate for parallax associated with variations among the sensor arrays.

60. The imager calibration system of claim 51, wherein the processor is adapted to:
update the offset correction terms; and
damp changes to the offset correction terms.

61. The imager calibration system of claim 51, wherein the processor is adapted adjust the offset correction terms to compensate for different sensitivities of the sensors.

62. The imager calibration system of claim 51, wherein the imager calibration system is a thermal camera further comprising a housing, wherein the imager array is disposed in the housing.

63. A method of calibrating an imaging system, the method comprising:
receiving electromagnetic radiation from a scene at an imager array, wherein the imager array comprises a plurality of sensor arrays, and wherein each sensor array comprises a lens adapted to receive the electromagnetic radiation from the scene and a plurality of sensors adapted to capture an image of the scene based on the electromagnetic radiation received through the lens;
receiving a plurality of pixel values associated with the images captured by the sensors of the sensor arrays;
mapping the sensors to a coordinate space, wherein at least one sensor of each sensor array is mapped to each coordinate of the coordinate space; and
calculating an offset correction term for each sensor based on the pixel values of all sensors mapped to the same coordinate.

64. The method of claim 63, wherein the method is performed without obscuring the scene from view by the imager array.

65. The method of claim 63, further comprising:
accumulating the pixel values of all sensors mapped to each coordinate to provide an accumulated value for each coordinate; and
using the accumulated values to determine a mean value for each coordinate to calculate the offset correction terms.

66. The method of claim 63, further comprising:
determining differences between the pixel value of each sensor and the pixel values of all other sensors mapped to the same coordinate; and
accumulating the differences to calculate the offset correction terms.

67. The method of claim 66, further comprising mapping each coordinate to at least one sensor of each sensor array by horizontal and vertical offset values to determine the differences.

68. The method of claim 63, further comprising interpolating at least some of the pixel values to calculate at least one of the offset correction terms.

69. The method of claim 63, further comprising interpolating at least some of the coordinates to map at least one of the sensors to the coordinate space.

70. The method of claim 63, wherein the mapping comprises mapping the sensors to the coordinate space by horizontal and vertical offset values to account for variations among the sensor arrays.

71. The method of claim 63, further comprising adjusting the mapping to compensate for parallax associated with variations among the sensor arrays.

72. The method of claim 63, further comprising:
updating the offset correction terms; and
damping changes to the offset correction terms.

73. The method of claim 63, further comprising adjusting the offset correction terms to compensate for different sensitivities of the sensors.

74. The method of claim 63, wherein the imager array is disposed in a housing of a thermal camera.

* * * * *